(12) United States Patent
Tani et al.

(10) Patent No.: US 10,790,409 B2
(45) Date of Patent: Sep. 29, 2020

(54) NITRIDE SEMICONDUCTOR LIGHT-EMITTING ELEMENT

(71) Applicant: Sharp Kabushiki Kaisha, Sakai, Osaka (JP)

(72) Inventors: Yoshihiko Tani, Sakai (JP); Tetsuya Hanamoto, Sakai (JP); Masanori Watanabe, Sakai (JP); Akihiro Kurisu, Sakai (JP); Katsuji Iguchi, Sakai (JP); Hiroyuki Kashihara, Sakai (JP); Tomoya Inoue, Sakai (JP); Toshiaki Asai, Sakai (JP); Hirotaka Watanabe, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/101,559

(22) Filed: Aug. 13, 2018

(65) Prior Publication Data

US 2019/0006555 A1    Jan. 3, 2019

Related U.S. Application Data

(63) Continuation of application No. 15/511,750, filed as application No. PCT/JP2015/074698 on Aug. 31, 2015, now Pat. No. 10,084,111.

(30) Foreign Application Priority Data

Sep. 22, 2014 (JP) ................................ 2014-192670

(51) Int. Cl.
H01L 33/04 (2010.01)
H01L 21/205 (2006.01)
(Continued)

(52) U.S. Cl.
CPC ............ *H01L 33/04* (2013.01); *H01L 21/205* (2013.01); *H01L 33/025* (2013.01); *H01L 33/06* (2013.01);
(Continued)

(58) Field of Classification Search
CPC ....................................................... H01L 33/04
(Continued)

(56) References Cited

U.S. PATENT DOCUMENTS

| | | | | |
|---|---|---|---|---|
| 7,799,699 B2 * | 9/2010 | Nuzzo | ..................... | H01L 29/72 438/758 |
| 2007/0284564 A1 * | 12/2007 | Biwa | ..................... | B82Y 20/00 257/13 |

OTHER PUBLICATIONS

Tani et al., "Nitride Semiconductor Light-Emitting Element", U.S. Appl. No. 15/511,750, filed Mar. 16, 2017.

* cited by examiner

*Primary Examiner* — Jami Valentine Miller
(74) *Attorney, Agent, or Firm* — Keating & Bennett, LLP

(57) ABSTRACT

A nitride semiconductor light-emitting element includes at least an n-type nitride semiconductor layer, a light-emitting layer, and a p-type nitride semiconductor layer. A multilayer body is provided between the n-type nitride semiconductor layer and the light-emitting layer, having at least one stack of first and second semiconductor layers. The second semiconductor layer has a greater band-gap energy than the first semiconductor layer. The first and second semiconductor layers each have a thickness of more than 10 nm and 30 nm or less. In applications in which luminous efficiency at room temperature is a high priority, the first semiconductor layer has a thickness of more than 10 nm and 30 nm or less, the second semiconductor layer has a thickness of more than 10 nm and 40 nm or less, and the light-emitting layer has V-shaped recesses in cross-sectional view.

29 Claims, 15 Drawing Sheets

(51) Int. Cl.
    *H01L 33/32*    (2010.01)
    *H01L 33/02*    (2010.01)
    *H01L 33/06*    (2010.01)
    *H01L 33/12*    (2010.01)
    *H01L 33/24*    (2010.01)

(52) U.S. Cl.
    CPC .............. *H01L 33/12* (2013.01); *H01L 33/24* (2013.01); *H01L 33/32* (2013.01)

(58) Field of Classification Search
    USPC .......................................................... 257/3
    See application file for complete search history.

NITRIDE SEMICONDUCTOR LIGHT-EMITTING ELEMENT

TECHNICAL FIELD

The present invention relates to a nitride semiconductor light-emitting element.

BACKGROUND ART

Nitrogen-containing Group III-V compound semiconductors (Group III nitride semiconductors) have a band-gap energy that corresponds to the energy of light of infrared to ultraviolet wavelengths. This makes Group III nitride semiconductors useful materials for light-emitting elements that emit light of infrared to ultraviolet wavelengths and for light-receiving elements that receive light of infrared to ultraviolet wavelengths.

Group III nitride semiconductors are composed of atoms bonded together by strong atomic forces and have a high dielectric breakdown voltage and a large saturated electron velocity. These make Group III nitride semiconductors useful materials for electronic devices such as high-temperature-resistant and high-power radiofrequency transistors, too. Practically harmless to the environment, furthermore, Group III nitride semiconductors have been receiving attention as easy-to-handle materials.

A nitride semiconductor light-emitting element in which such a Group III nitride semiconductor is used typically has a quantum-well light-emitting layer. When voltage is applied to the nitride semiconductor light-emitting element, electrons and holes are recombined in a well layer as a component of the light-emitting layer and generate light. The light-emitting layer may have the Single Quantum Well (SQW) structure, or may alternatively have the Multiple Quantum Well (MQW) structure, in which well layers are stacked alternately with barrier layers.

The well layers in the light-emitting layer are usually InGaN layers, and the barrier layers are usually GaN layers. The resulting device is, for example, a blue LED (Light Emitting Diode) having a peak emission wavelength of approximately 450 nm, and this blue LED can be combined with a phosphor to form a white LED. When the barrier layers are AlGaN layers, the increased difference in band-gap energy between the barrier and well layers will lead to enhanced luminous efficiency. AlGaN, however, is difficult to grow into crystals with good quality compared with GaN.

Typical N-type nitride semiconductor layers used in nitride semiconductor light-emitting elements are GaN and InGaN layers.

For example, the nitride semiconductor light-emitting element described in Japanese Unexamined Patent Application Publication No. 11-214746 (PTL 1) has, between a substrate and a light-emitting layer, a first nitride semiconductor layer having an n-type impurity of $1 \times 10^{17}$ cm$^{-3}$ or less, a second nitride semiconductor layer having an n-type impurity of $3 \times 10^{18}$ cm$^{-3}$ or less, and a third nitride semiconductor layer having an n-type impurity of $1 \times 10^{17}$ cm$^{-3}$ or less, with the first one closest to the substrate. According to PTL 1, the low n-type impurity concentrations of the first and third layers make these layers highly crystalline underlying layers, and the good crystallinity of the first layer helps the second layer, which has a higher n-type impurity concentration, grow with good crystallinity on the first layer.

Japanese Unexamined Patent Application Publication No. 11-330554 (PTL 2) describes a nitride semiconductor light-emitting element that has a light-emitting layer between an n-type nitride semiconductor layer and a p-type nitride semiconductor layer. In this nitride semiconductor light-emitting element, the n-type nitride semiconductor layer is an n-type multilayer film layer that is a stack of an In-containing first nitride semiconductor layer and a second nitride semiconductor layer whose composition is different from that of the first nitride semiconductor layer. At least one of the first and second nitride semiconductor layers has a thickness of 100 Angstroms or less. According to PTL 2, high crystallinity of the light-emitting layer, gained as a result of the superlattice structure of the n-type multilayer film layer in particular, improves the efficiency of the nitride semiconductor light-emitting element.

The nitride semiconductor device described in Japanese Unexamined Patent Application Publication No. 10-126006 has a first nitride semiconductor layer on and in contact with at least one side of a light-emitting layer. The first nitride semiconductor layer has a greater band-gap energy than the light-emitting layer, and second and third nitride semiconductor layers are provided on the first nitride semiconductor layer. The second nitride semiconductor layer has a smaller band-gap energy than the first nitride semiconductor layer, and the third nitride semiconductor layer has a greater band-gap energy than the second nitride semiconductor layer. According to PTL 3, the invention provides a nitride semiconductor device with high luminous efficiency.

Another disclosed structure is aimed at improving optical power and reducing leakage current and includes V-pits created in an upper portion of an n-type nitride semiconductor layer. The V-pits are carried over to an active layer and closed by a p-type nitride semiconductor layer. The importance is on a structure of the n-type nitride semiconductor layer and a formation method that provide desirable V-pits.

Japanese Patent No. 3904709 (PTL 4) discloses a structure that includes an "n-type $In_{0.1}Ga_{0.9}N/In_{0.02}Ga_{0.98}N$ multiple quantum well adjacent layer (Si-doped, $5 \times 10^{17}$ cm$^{-3}$; well width, 2 nm; barrier width, 4 nm; 20 layers)," an "$In_{0.2}Ga_{0.8}N/In_{0.05}Ga_{0.95}N$ multiple quantum well active layer (undoped; well width, 2 nm; barrier width, 4 nm; 10 layers)" thereon, and a "p-type GaN adjacent layer (Mg-doped, $5 \times 10^{17}$ cm$^{-3}$; 0.1 μm) thereon. The multiple quantum well adjacent layer has pits. The pits are carried over to the multiple quantum well active layer above and closed by the p-type GaN adjacent layer. The multiple quantum well adjacent layer has a structure now commonly referred to as the superlattice structure after its configuration.

Japanese Patent No. 3612985 (PTL 5) discloses that forming a 0.5-μm thick silicon-doped GaN layer (electron concentration, $1 \times 10^{18}$/cm$^3$) as a "strain relief layer" under an active layer at relatively low temperatures generates many V-pits, with some in the active layer. According to PTL 5, this significantly improves the photoluminescence characteristics of the active layer.

Japanese Patent No. 5415756 (PTL 6) and Japanese Patent No. 5603366 (PTL 7) disclose structures that have a superlattice layer referred to as a pit opening layer under an active region (active layer). Quantum well layers and a hole injection layer extend into pits originating from threading dislocations, and the pits are closed by a p-type contact layer. According to PTL 6 and 7, this improves luminous and wall-plug efficiency.

CITATION LIST

Patent Literature

PTL 1: Japanese Unexamined Patent Application Publication No. 11-214746

PTL 2: Japanese Unexamined Patent Application Publication No. 11-330554
PTL 3: Japanese Unexamined Patent Application Publication No. 10-126006
PTL 4: Japanese Patent No. 3904709
PTL 5: Japanese Patent No. 3612985
PTL 6: Japanese Patent No. 5415756
PTL 7: Japanese Patent No. 5603366

SUMMARY OF INVENTION

Technical Problem

A nitride semiconductor light-emitting element typically has a (strained-layer) superlattice structure (the (strained-layer) superlattice structure is formed of a nitride semiconductor) composed of periodically stacked layers having thicknesses of 10 nm (100 Å) or less (e.g., approximately 1 to 6 nm) under a light-emitting layer. This reportedly enables effective relaxation of the strain put on the light-emitting layer and thus ensures good light-emitting characteristics.

For further improvements in light-emitting characteristics, however, it is also important to reduce the density of threading dislocations in the light-emitting layer besides strain relaxation. In particular, improvements in the thermal characteristics of light-emitting elements cannot be achieved without reducing the density of threading dislocations. Thermal characteristics of a light-emitting element as mentioned herein refers to the proportion of luminous efficiency at a high temperature (e.g., 80° C.) to that at room temperature. In general, the thermal characteristics of a light-emitting element decreases with elevating operating temperature of the light-emitting element. From the practical perspective, light-emitting elements need to have high thermal characteristics.

According to findings from the inventors' recent research, however, the above configuration in which a (strained-layer) superlattice structure is disposed under a light-emitting layer is of limited effectiveness in reducing the density of threading dislocations.

Meanwhile, there is increasing evidence that in applications in which luminous efficiency at room temperature is a high priority, such as LEDs for use as backlighting in mobile liquid crystal displays, it is important to form an active layer with good crystallinity and, in addition to this, create V-pits in the active layer. Two models have been proposed to explain the role of V-pits which has not been fully understood: an increased luminous efficiency resulting from direct injection of holes from the V-pits into the quantum wells as a component of the light-emitting layer; and an increased luminous efficiency as a result of layers by which the V-pits are closed serving as barrier layers that prevent carriers in the quantum well layers from being lost. Those LEDs that have a V-pitted light-emitting layer also generally have a superlattice structure as an underlying layer for the light-emitting layer.

Made in light of the foregoing, the present invention is intended to further improve the light-emitting characteristics of nitride semiconductor light-emitting elements.

Solution to Problem

The inventors found that the density of threading dislocations in a light-emitting layer is more effectively reduced by placing a multilayer body of n-type nitride semiconductor layers under the light-emitting layer. A multilayer body of n-type nitride semiconductor layers as mentioned herein refers to a structure composed of periodically stacked layers with different band-gap energies and relatively large thicknesses (e.g., layers having a thickness of more than 10 nm and 30 nm or less). In other words, the inventors found that when each of the n-type nitride semiconductor layers constituting the multilayer body has a thickness of more than 10 nm and 30 nm or less, the light-emitting layer has a reduced density of threading dislocations as a result of threading dislocations being deflected at the interfaces between layers with different band-gap energies.

The inventors also found that those LEDs for applications in which luminous efficiency at room temperature is a high priority can have the above multilayer body, rather than the underlying structure, as an underlying structure with high planarity of its crystal growth surface, and that combining this multilayer body with a light-emitting layer having V-shaped recesses (V-pits) further improves luminous efficiency.

A nitride semiconductor light-emitting element according to the present invention includes at least an n-type nitride semiconductor layer, a light-emitting layer, and a p-type nitride semiconductor layer. A multilayer body is provided between the n-type nitride semiconductor layer and the light-emitting layer, and the multilayer body has at least one stack of first and second semiconductor layers. The second semiconductor layer has a greater band-gap energy than the first semiconductor layer. Each of the first and second semiconductor layers has a thickness of more than 10 nm and 30 nm or less.

A nitride semiconductor light-emitting element according to the present invention includes, in an LED for applications in which luminous efficiency at room temperature is a high priority, at least an n-type semiconductor layer, a light-emitting layer, and a p-type semiconductor layer. A multilayer body is provided between the n-type nitride semiconductor layer and the light-emitting layer, and the multilayer body has at least one stack of first and second semiconductor layers. The second semiconductor layer has a greater band-gap energy than the first semiconductor layer. The first semiconductor layer has a thickness of more than 10 nm and 30 nm or less. The second semiconductor layer has a thickness of more than 10 nm and 40 nm or less. The light-emitting layer has a plurality of V-shaped recesses (V-pits) in cross-sectional view.

Preferably, the first semiconductor layer is an $Al_{x1}In_{y1}Ga_{1-x1-y1}N$ ($0 \leq x1 < 1$ and $0 < y1 \leq 1$) layer, and the second semiconductor layer is an $Al_{x2}In_{y2}Ga_{1-x2-y2}N$ ($0 \leq x2 < 1$ and $0 \leq y2 < 1$) layer.

Preferably, each of the first and second semiconductor layers has an n-type impurity concentration of $3 \times 10^{18}$ cm$^{-3}$ or more and less than $1.1 \times 10^{19}$ cm$^{-3}$. More preferably, the first and second semiconductor layers have equal n-type impurity concentrations.

Preferably, the first and second semiconductor layers have equal thicknesses. Preferably, the multilayer body has three to seven stacks of the first and second semiconductor layers. More preferably, the light-emitting layer lies in contact with the multilayer body. In this case, the second semiconductor layer closest to the light-emitting layer is in contact with the light-emitting layer.

Preferably, an n-type buffer layer (the second n-type buffer layer discussed hereinafter) is provided between the multilayer body and the light-emitting layer. Preferably, the n-type buffer layer is an $Al_{x3}In_{y3}Ga_{1-x3-y3}N$ ($0 \leq x3 < 1$ and $0 \leq y3 < 1$) layer that contains an n-type impurity and lies in contact with the light-emitting layer.

The band-gap energy of the n-type buffer layer may be equal to or greater than that of the second semiconductor layer, equal to or less than that of the first semiconductor layer, or smaller than that of the second semiconductor layer and greater than that of the first semiconductor layer.

Preferably, the n-type buffer layer has a thickness of 30 nm or less.

Preferably, an n-type buffer layer (the first n-type buffer layer discussed hereinafter) is provided between the n-type nitride semiconductor layer and the multilayer body. Preferably, the n-type buffer layer between the n-type nitride semiconductor layer and the multilayer body is an $Al_{s4}In_{t4}Ga_{1-s4-t4}N$ ($0 \leq s4 < 1$ and $0 \leq t4 < 1$) layer that contains an n-type impurity and lies in contact with the multilayer body.

Preferably, the n-type buffer layer between the n-type nitride semiconductor layer and the multilayer body has a band-gap energy equal to that of the second semiconductor layer. Preferably, the n-type buffer layer between the n-type semiconductor layer and the multilayer body has an n-type impurity concentration equal to at least one of the n-type impurity concentrations of the first and second semiconductor layers. Preferably, the n-type buffer layer between the n-type nitride semiconductor layer and the multilayer body has a thickness of 50 nm or less.

The light-emitting layer is preferably an undoped layer, more preferably having the single quantum well structure or a multiple quantum well structure in which well layers are stacked alternately with $Al_fIn_gGa_{1-f-g}N$ ($0 \leq f \leq 0.01$ and $0 \leq g \leq 0.01$) barrier layers.

Preferably, the light-emitting layer has V-shaped recesses (V-pits) in cross-sectional view that reach the multilayer body at the bottom of the V-shape thereof.

Preferably, the V-shaped recesses (V-pits) are present as a large number of scattered cavities in plan view of the top portion of the light-emitting layer with the plane surface density of the V-shaped recesses (V-pits) being $1 \times 10^8/cm^2$ or more.

Advantageous Effects of Invention

The present invention further improves the light-emitting characteristics of nitride semiconductor light-emitting elements.

BRIEF DESCRIPTION OF DRAWINGS

FIG. 1 (b) is an enlarged view of features of a nitride semiconductor light-emitting element according to an embodiment of the present invention.

FIG. 3 (b) is a graph of the thermal characteristics of the luminous intensity of a nitride semiconductor light-emitting element according to an embodiment of the present invention versus Si level in its first and second semiconductor layers.

DESCRIPTION OF EMBODIMENTS

Figure 1:
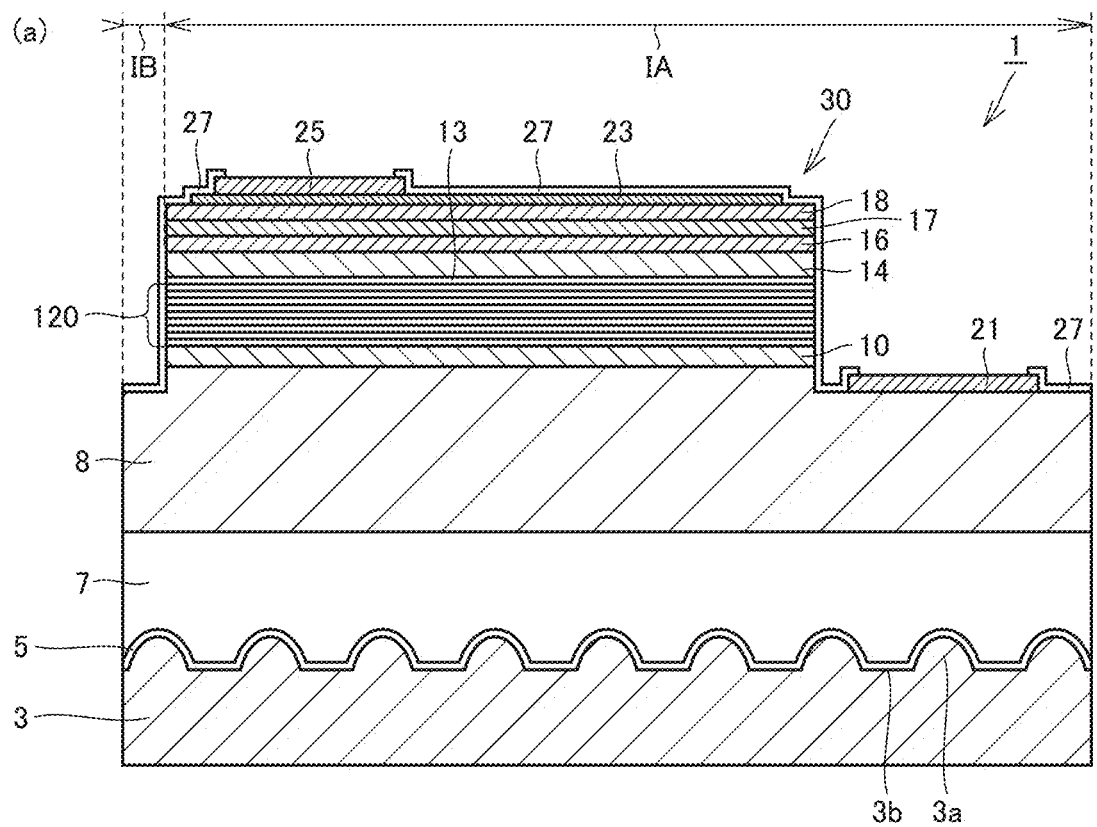
FIG. 1 (a) is a cross-section of a nitride semiconductor light-emitting element according to an embodiment of the present invention.
Figure 1:
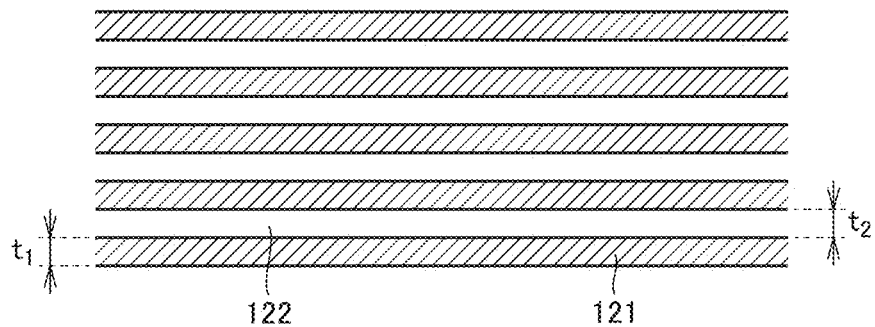

The following describes nitride semiconductor light-emitting elements according to the present invention with reference to drawings. In the drawings of the present invention, the same reference numerals refer to the same or corresponding parts. To make the drawings clear and simple, the proportions of dimensions such as lengths, widths, thicknesses, and depths are not to scale and do not represent actual proportions.

In the following, portions on the lower side direction of FIG. 1 (a) may be described using words such as "lower," "below," "under," "beneath," and "bottom," and those on the upper side direction of FIG. 1 (a) may be described using words such as "upper," "above," "on," and "top." These expressions are for the sake of convenience and different from the terms "upper" and "lower" etc. according to the direction of gravity.

Figure 5:
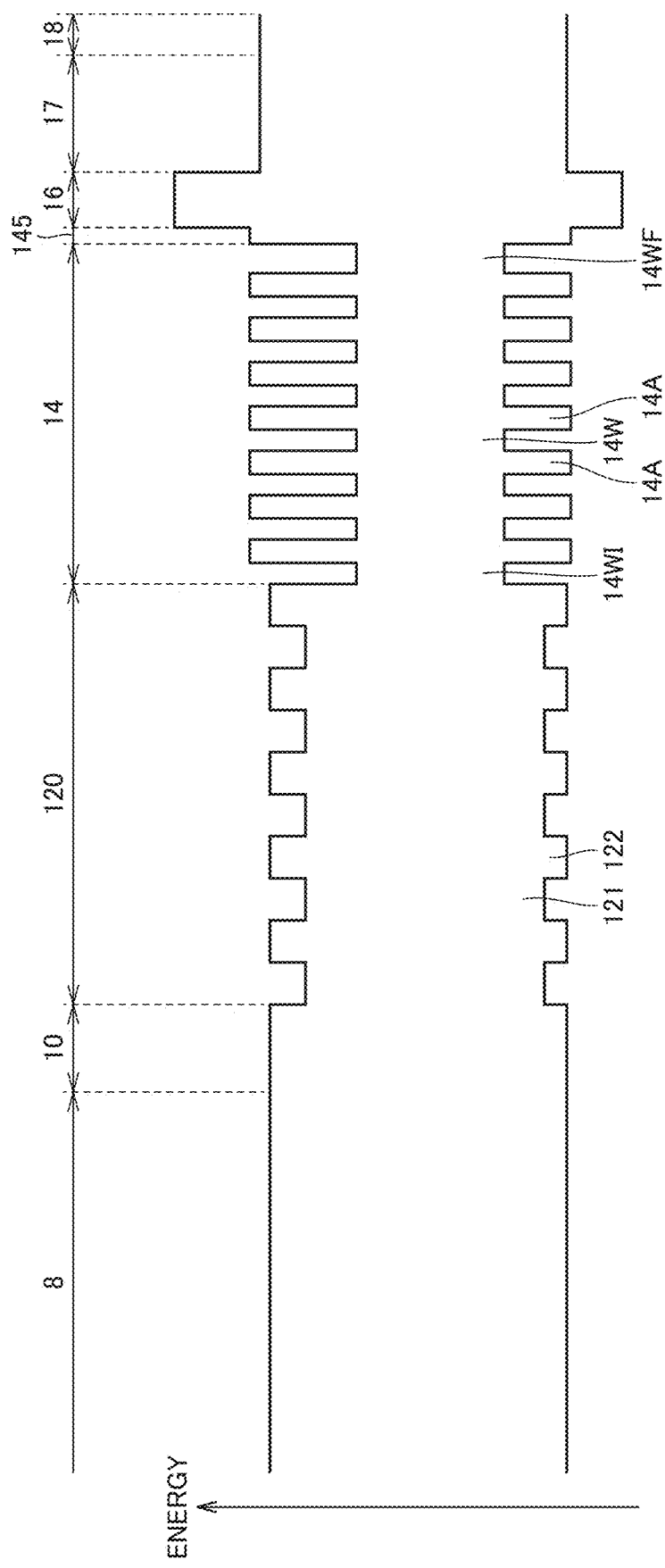
FIG. 5 is an energy band diagram that schematically illustrates the band structure of the nitride semiconductor light-emitting element according to Example 1.

A "well layer 14W" refers to a layer interposed between barrier layers (e.g., see FIG. 5). A well layer not interposed between barrier layers is referred to as "the initial well layer 14WI" or "the final well layer 14WF" (e.g., see FIG. 5); well layers are termed differently according to whether or not they are interposed between barrier layers. "The initial well layer 14WI" is on the n-type nitride semiconductor layer side, and "the final well layer 14F" is on the p-type nitride semiconductor layer side.

In the following, two different concentrations are used, "impurity concentration" and "carrier concentration," the latter being the concentration of electrons resulting from doping with an n-type impurity or that of holes resulting from doping with a p-type impurity. The relationship between a "n-type impurity concentration" and a "carrier concentration" is discussed hereinafter.

A "carrier gas" is a gas other than Group III, Group V, and impurity raw-material gases. The atoms constituting a carrier gas are not incorporated into any component such as films.

An "n-type nitride semiconductor layer" may include a low-carrier-concentration n-type or undoped layer whose thickness is such that electrons are practically free to pass through the layer. An "p-type nitride semiconductor layer" may include a low-carrier-concentration p-type or undoped layer whose thickness is such that holes are practically free to pass through the layer. The term "practically free to pass through the layer" means that the nitride semiconductor light-emitting element has an operating voltage suitable for practical use.

<Structure of the Nitride Semiconductor Light-Emitting Element>

FIG. 1 (a) is a cross-section of a nitride semiconductor light-emitting element according to an embodiment of the present invention. FIG. 1 (b) is an enlarged view of features of the nitride semiconductor light-emitting element illustrated in FIG. 1 (a). In FIG. 1 (a), region IA illustrates a cross-sectional structure viewed along line IA-IA in FIG. 2, and region IB illustrates a cross-sectional structure viewed along line IB-IB in FIG. 2.

The nitride semiconductor light-emitting element 1 in FIG. 1 includes a substrate 3, a buffer layer 5, an underlying layer 7, an n-type contact layer (n-type nitride semiconductor layer) 8, a first n-type buffer layer (n-type buffer layer between an n-type nitride semiconductor layer and a multilayer body) 10, a multilayer body 120, a second n-type buffer layer (n-type buffer layer between a multilayer body and a light-emitting layer) 13, a light-emitting layer 14, and p-type nitride semiconductor layers 16, 17, and 18. The second n-type buffer layer 13 is optional.

The first n-type buffer layer 10, the multilayer body 120, the second n-type buffer layer 13, the light-emitting layer, the p-type nitride semiconductor layers 16, 17, 18 and part of the n-type contact layer 8 are etched to form a mesa portion 30. There is a p-side electrode 25 on the top surface of the p-type nitride semiconductor layer 18 with a transparent electrode 23 therebetween. Outside the mesa portion 30 (the right side of FIG. 1 (a)), there is an n-type electrode 21 on an exposed surface of the n-type contact layer 8. The transparent protection film 27 covers the transparent electrode 23 and the etch-exposed sides of layers. The n-side electrode 21 and the p-side electrode 25 are exposed, not covered with the transparent protection film 27.

The substrate 3, the buffer layer 5, the underlying layer 7, and the n-type contact layer 8 are preferably formed by known techniques. Their configurations are not critical in the present invention and therefore not described in detail hereinafter. Their configurational parameters, such as material, composition, formation process and conditions, thickness, and impurity concentration, may be variously combined with those in known technologies.

Figure 2:
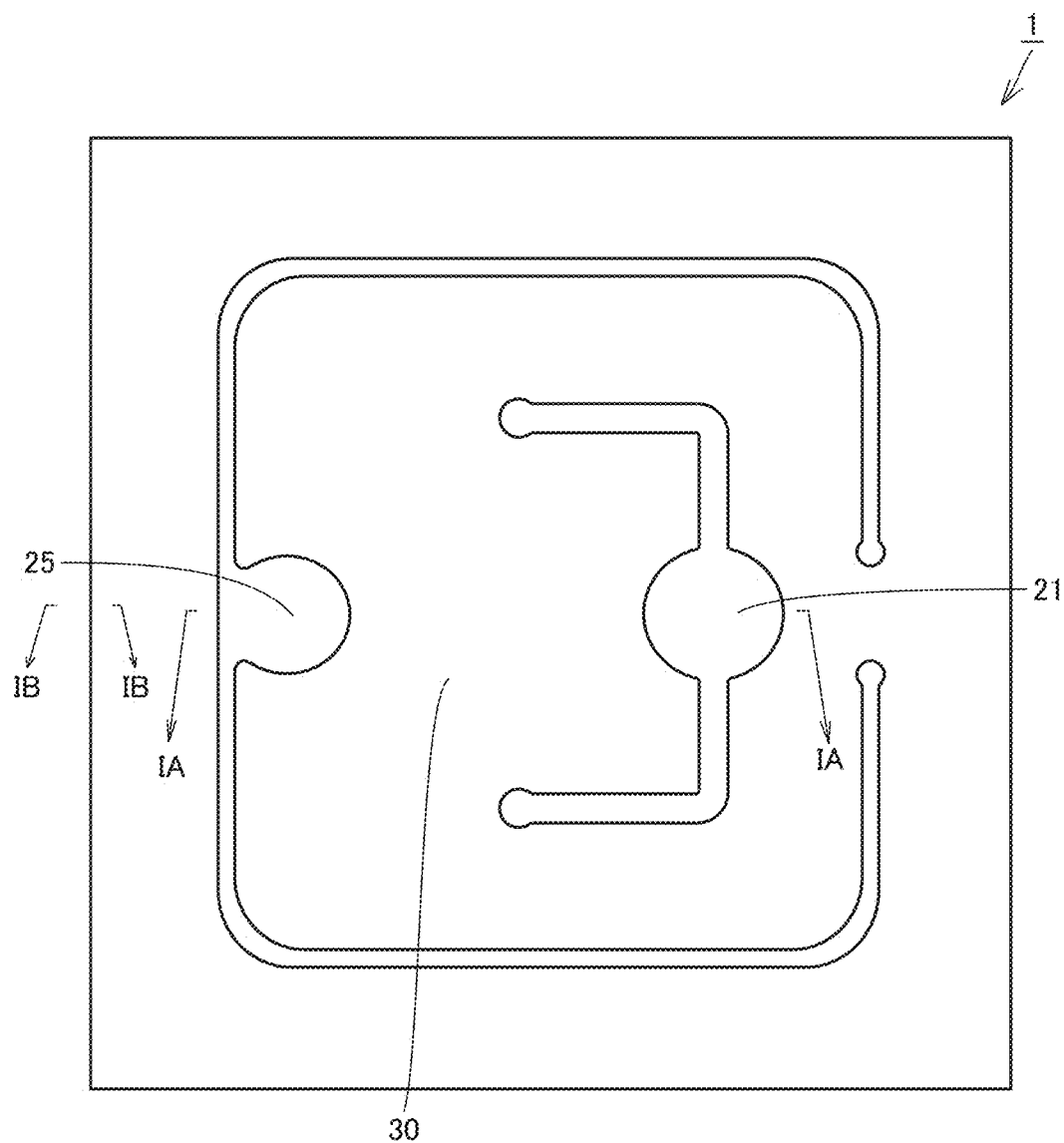
FIG. 2 is a plan view of a nitride semiconductor light-emitting element according to an embodiment of the present invention.

The two-dimensional structure of the nitride semiconductor light-emitting element 1, illustrated in FIG. 2, can be selected from the various known two-dimensional structures. The two-dimensional structure may be one that enables the flip chip connection, a method of connection in which the nitride semiconductor light-emitting element is connected to a substrate upside down, unlike that in FIG. 2. The two-dimensional structure of the nitride semiconductor light-emitting element 1 is therefore not critical in the present invention and not described in detail hereinafter either.

<First N-Type Buffer Layer>

The first n-type buffer layer 10 is provided between the n-type contact layer 8 and the multilayer body 120. The n-type contact layer 8 is grown rapidly at a high temperature, whereas the light-emitting layer 14 is grown more slowly and at a lower temperature than the n-type contact layer 8. The manufacture of the nitride semiconductor light-emitting element 1 therefore involves a switch from high to low for the temperature at which the nitride semiconductor layers are grown and from fast to slow for the growth rate. During this switch, the first n-type buffer layer 10 serves as a buffer layer.

The first n-type buffer layer 10 is grown at a lower temperature and more slowly than the n-type contact layer 8, and this gives it a growth surface (top surface) smoother than that of the n-type contact layer 8. However, the first n-type buffer layer 10 is considered to have substantially no effect in reducing dislocations or other crystallographic defects.

The first n-type buffer layer 10 is grown at a lower temperature than the n-type contact layer 8. In the first n-type buffer layer 10, thus, some dislocations start to form what is called V-pits, according to observations. Preferably, the first n-type buffer layer 10 lies in contact with the multilayer body 120. This improves the controllability of the V-pit structure (the V-pit structure reduces the influence of threading dislocations).

The first n-type buffer layer 10 preferably has a thickness of 50 nm or less. This limits the waviness of the growth surface (top surface) of the first n-type buffer layer 10. It is more preferred that the thickness of the first n-type buffer layer 10 be 5 nm or more, even more preferably 10 nm or more. This gives the first n-type buffer layer 10 a smooth growth surface.

The first n-type buffer layer 10 preferably has an n-type impurity concentration of $3 \times 10^{18}$ cm$^{-3}$ or more and $1.1 \times 10^{19}$ cm$^{-3}$ or less. Too high an n-type impurity concentration of the first n-type buffer layer 10 can cause low luminous efficiency at the light-emitting layer 14, which is formed above the first n-type buffer layer 10. In light of this, it is preferred that the first n-type buffer layer 10 have an n-type impurity concentration equal to that of the first or second semiconductor layer 121 or 122 as a component of the multilayer body 120. The influence of the n-type impurity in the first n-type buffer layer 10 is considered not as significant as that of the n-type impurity in the multilayer body 120 because the first n-type buffer layer 10 is thinner than the multilayer body 120.

"The first n-type buffer layer 10 has an n-type impurity concentration equal to that of the first semiconductor layer 121 as a component of the multilayer body 120" includes cases in which the n-type impurity concentration of the first n-type buffer layer 10 is 0.85 times or more and 1.15 times or less that of the first semiconductor layer 121. "The first n-type buffer layer 10 has an n-type impurity concentration equal to that of the second semiconductor layer 122 as a component of the multilayer body 120" includes cases in which the n-type impurity concentration of the first n-type buffer layer 10 is 0.85 times or more and 1.15 times or less that of the second semiconductor layer 122.

It is preferred that in the first n-type buffer layer 10, the n-type impurity concentration be meaningfully lower than in the n-type contact layer 8. This limits the emergence of new dislocations while helping in smoothing the growth surface of the first n-type buffer layer 10.

The first n-type buffer layer 10 is preferably an n-doped $Al_{s4}In_{t4}Ga_{1-s4-t4}N$ ($0 \leq s4 \leq 1$ (more preferably $0 \leq s4 < 1$) and $0 \leq t4 \leq 1$ (more preferably $0 \leq t4 < 1$)) layer. More preferably, the first n-type buffer layer 10 is an n-doped $In_{u4}Ga_{1-u4}N$ ($0 \leq u4 \leq 1$, preferably $0 \leq u4 \leq 0.5$, more preferably $0 \leq u4 \leq 0.15$) layer.

It is preferred that the lattice mismatch of the first n-type buffer layer 10, which is provided between the n-type contact layer 8 and the multilayer body 120, with the n-type contact layer 8 and the second semiconductor layers 122 as a component of the multilayer body 120 be minimized. A greater degree of this lattice mismatch leads to a higher risk of new crystallographic defects. It is therefore preferred that the first n-type buffer layer 10 have a band-gap energy equal to that of the n-type contact layer or the second semiconductor layers as a component of the multilayer body 120. For example, it is preferred that the first n-type buffer layer 10 be an n-type GaN layer (25-nm thick).

"The first n-type buffer layer 10 has a band-gap energy equal to that of the n-type contact layer 8" includes cases in which the band-gap energy of the first n-type buffer layer 10 is 0.9 times or more and 1.1 times or less that of the n-type contact layer 8. "The first n-type buffer layer 10 has a band-gap energy equal to that of the second semiconductor layers 122 as a component of the multilayer body 120" includes cases in which the band-gap energy of the first n-type buffer layer 10 is 0.9 times or more and 1.1 times or less that of the second semiconductor layers 122.

<Multilayer Body>

Through extensive research, the inventors found that a multilayer body 120 provided between the first n-type buffer layer 10 and the light-emitting layer 14 ensures that the crystal quality of the layers formed on the multilayer body 120 (e.g., the light-emitting layer 14) remains high. This is considered to ensure that luminous efficiency remains high during high-temperature or high-rate driving. The following describes the configuration of the multilayer body 120.

The multilayer body 120 has at least one stack of first and second semiconductor layers 121 and 122. "Stack of first and second semiconductor layers 121 and 122" includes cases in which a stack has two or more first semiconductor layers 121 and two or more second semiconductor layers 122, besides the case in which a stack is composed of one first semiconductor layer 121 and one second semiconductor layer 122. When a stack has two or more first semiconductor layers 121 and two or more second semiconductor layers 122, the first semiconductor layers 121 alternate with the second semiconductor layers 122 to form the stack. Specifically, in the multilayer body 120, first semiconductor layers 121 are stacked alternately with second semiconductor layers 122 having a greater band-gap energy than the first semiconductor layers 121, with each first semiconductor layer 121 on the first n-type buffer layer 10 side.

The first and second semiconductor layers 121 and 122 each have a thickness $t_1$ or $t_2$ of more than 10 nm and 30 nm or less. In applications in which luminous efficiency at room temperature is a high priority, the first semiconductor layer 121 has a thickness $t_1$ of more than 10 nm and 30 nm or less, and the second semiconductor layer 122 has a thickness $t_2$ of more than 10 nm and 40 nm or less. This ensures that threading dislocations occurring under the multilayer body 120 are deflected at the interface between the first and second semiconductor layers 121 and 122. The lowered density of threading dislocations in the light-emitting layer 14 ensures that the crystal quality of the light-emitting layer 14 remains high. As a result, the light-emitting characteristics of the nitride semiconductor light-emitting element 1 is further improved. For example, luminous efficiency remains high during high-temperature or high-rate driving. Preferably, the first and second semiconductor layers 121 and 122 each have a thickness $t_1$ or $t_2$ of 15 nm or more and 30 nm or less. In applications in which luminous efficiency at room temperature is a high priority, it is preferred that the first semiconductor layer 121 have a thickness $t_1$ of 15 nm or more and 30 nm or less with the second semiconductor layer 122 having a thickness $t_2$ of 15 nm or more and 40 nm or less. First and second semiconductor layers 121 and 122 having a thickness $t_1$ or $t_2$ exceeding 30 nm may affect the planarity of the growth surface (top surface) of the multilayer body 120. An observation of a cross-sectional TEM (Transmission Electron Microscope) image of the multilayer body 120 gives the thicknesses $t_1$ and $t_2$ of the first and second semiconductor layers 121 and 122.

It is preferred that the first and second semiconductor layers 121 and 122 each contain an n-type impurity. This further reduces the density of threading dislocations in the light-emitting layer 14. The reason the inventors consider is as follows. Adding an n-type impurity to the first semiconductor layer 121 changes the lattice constants of the Group III nitride semiconductor crystal that forms the first semiconductor layer 121. Likewise, adding an n-type impurity to the second semiconductor layer 122 changes the lattice constants of the Group III nitride semiconductor crystal that forms the second semiconductor layer 122. These changes make the interface between the first and second semiconductor layers 121 and 122 more effective in deflecting threading dislocations that occur under the multilayer body 120. As a result, the density of threading dislocations in the light-emitting layer 14 is further reduced. The n-type impurity concentration of each of the first and second semiconductor layers 121 and 122 is preferably $3 \times 10^{18}$ cm$^{-3}$ or more and less than $1.1 \times 10^{19}$ cm$^{-3}$, more preferably $6 \times 10^{18}$ cm$^{-3}$ and less than $1 \times 10^{19}$ cm$^{-3}$.

The first and second semiconductor layers 121 and 122 may have different n-type impurity concentration s, but preferably have equal n-type impurity concentration s. This helps in controlling the compositions or thicknesses of the first and second semiconductor layers 121 and 122. "The first and second semiconductor layers 121 and 122 have equal n-type impurity concentration s" means that the n-type impurity concentration of the first semiconductor layer 121 is 0.85 times or more and 1.15 times or less that of the second semiconductor layer 122.

Figure 3:
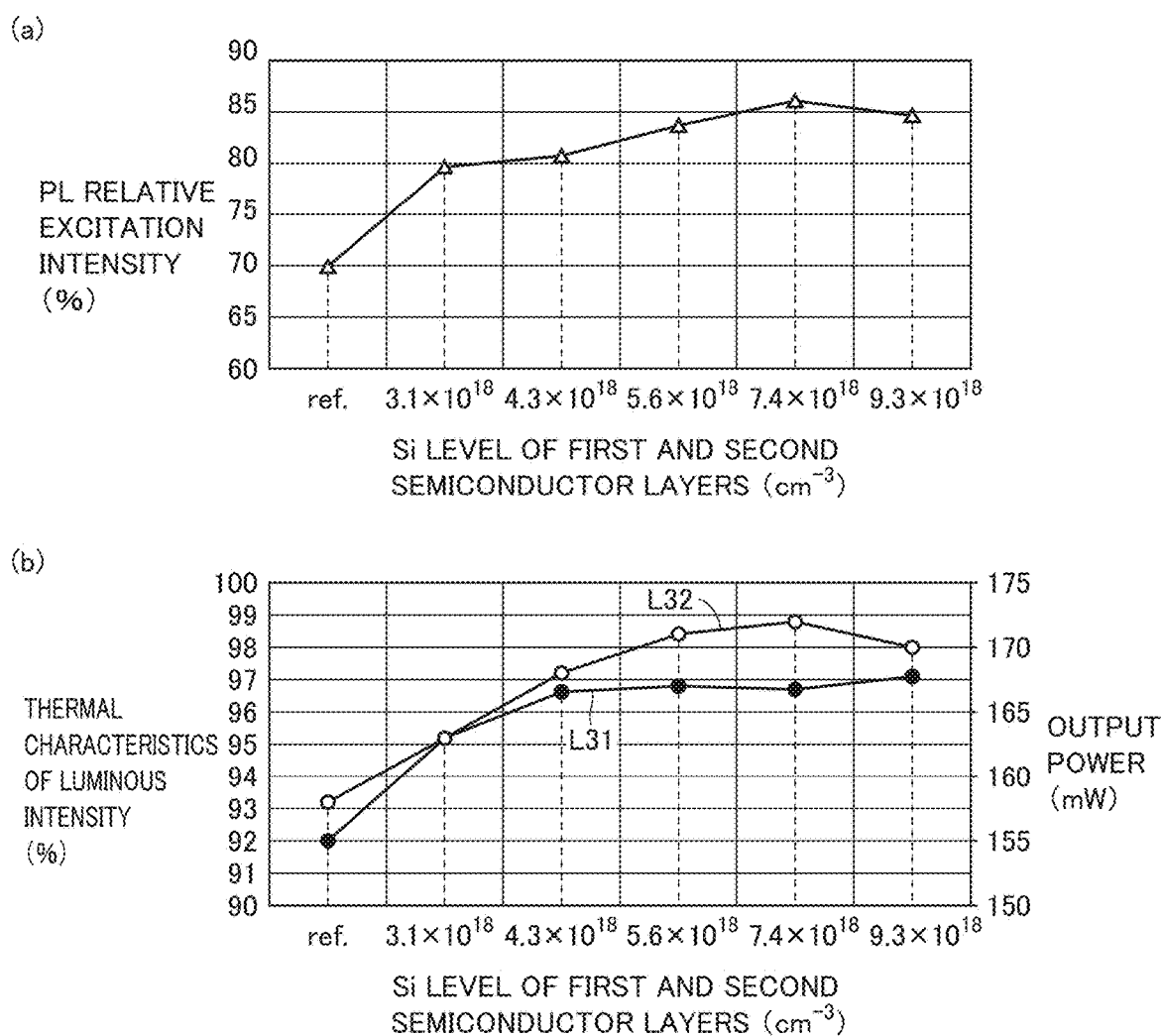
FIG. 3 (a) is a graph of the relative excitation intensity of PL (Photo Luminescence) emitted by a nitride semiconductor light-emitting element according to an embodiment of the present invention versus Si level in its first and second semiconductor layers.

The inventors studied the relative excitation intensity of photoluminescence (PL) with different n-doping (Si) levels of the first and second semiconductor layers 121 and 122 (both 12-nm thick), along with the luminous intensity of electroluminescence (EL) and its temperature dependence. The results are illustrated in FIGS. 3 (a) and 3 (b). The graph in FIG. 3 (a) illustrates the Si-level dependence of the relative excitation intensity of PL emitted by the nitride semiconductor light-emitting element 1 at the center of the nitride semiconductor light-emitting element 1 in top view. The "relative excitation intensity of PL" is defined as follows: PL relative excitation intensity R (%)=(Ia/Ib×10)× 100, where Ia is the intensity of photoluminescence at a first intensity of excitation light, and Ib is the intensity of photoluminescence at a second intensity of excitation light (the second intensity is 10 times the first intensity). In general, the PL relative excitation intensity R approaches 100% with higher crystal quality of the light-emitting layer 14.

FIG. 3 (b) illustrates data from a study in which the nitride semiconductor light-emitting element 1 was driven with electric current to emit light. In FIG. 3 (b), L31 represents the Si-level dependence of the thermal characteristics of luminous intensity (the proportion of the luminous intensity at 25° C. (luminous intensity at a wavelength of 450 nm) to that at 80° C. (luminous intensity at a wavelength of 450 nm)), and L32 represents the Si-level dependence of the output power of the nitride semiconductor light-emitting element. In FIGS. 3 (a) and 3 (b), "ref." means that the multilayer body 120 was omitted.

As illustrated in FIGS. 3 (a) and 3 (b), n-type impurity concentration s of the first and second semiconductor layers 121 and 122 of $3.1 \times 10^{18}$ cm$^{-3}$ or more led to high relative excitation intensities of PL, improved thermal characteristics of luminous intensity, and great output power. N-type impurity concentration s of the first and second semiconductor layers 121 and 122 of $5.6 \times 10^{18}$ cm$^{-3}$ or more resulted in higher relative excitation intensities of PL, further improved thermal characteristics of luminous intensity, and greater output power.

It is preferred that the thicknesses $t_1$ and $t_2$ of the first and second semiconductor layers 121 and 122 be equal. "The thicknesses of the first and second semiconductor layers 121 and 122 are equal" means that the thickness $t_1$ of the first semiconductor layer 121 is 0.9 times or more and 1.1 times or less the thickness $t_2$ of the second semiconductor layer 122. Even if the multilayer body 120 is thick, this prevents any adverse effects the large thickness of the multilayer body 120 would have on the layers grown on the multilayer body 120 (e.g., the light-emitting layer 14). For example, the decline in the crystal quality of the light-emitting layer 14 that would be caused by the large thickness of the multilayer body 120 is prevented.

The specific compositions of the nitride semiconductor layers that form the first and second semiconductor layers 121 and 122 are not critical. The first semiconductor layer 121 is preferably an $Al_{x1}In_{y1}Ga_{1-x1-y1}N$ ($0 \leq x1 < 1$ and $0 < y1 \leq 1$) layer, more preferably a $Ga_{z1}In_{1-z1}N$ ($0 < z1 < 1$) layer.

The second semiconductor layer 122 is preferably an $Al_{x2}In_{y2}Ga_{1-x2-y2}N$ ($0 \leq x2 < 1$ and $0 \leq y2 < 1$) layer, more preferably a GaN layer. The multilayer body 120 is preferably a stack of $Al_{x1}In_{y1}Ga_{1-x1-y1}N$ ($0 \leq x1 < 1$ and $0 < y1 \leq 1$) layers alternating with $Al_{x2}In_{y2}Ga_{1-x2-y2}N$ ($0 \leq x2 < 1$ and $0 \leq y2 < 1$) layers, more preferably a stack of $Ga_{z1}In_{1-z1}N$ ($0 < z1 < 1$) layers alternating with GaN layers.

The band-gap energy of the first semiconductor layer 121 can theoretically be any value that is 0.77 eV or more and less than 6.28 eV. In practice, however, it is preferred that the band-gap energy of the first semiconductor layer 121 be 2.952 eV or more and 3.425 eV or less, more preferably 3.100 eV or more and 3.379 eV or less.

The band-gap energy of the second semiconductor layer 122 can theoretically be any value that is more than 0.77 eV and 6.28 eV or less. In practice, however, it is preferred that the band-gap energy of the second semiconductor layer 122 be 3.024 eV or more and 3.616 eV or less, more preferably 3.289 eV or more and 3.496 eV or less.

Including In in the first semiconductor layer 121 offers the following two advantages. The first advantage is that dislocations are prevented from reaching the light-emitting layer 14. The high abundance of In, an element with a large atomic radius, in the first semiconductor layer 121 puts a great deal of stress on the first semiconductor layer 121. As a result, some dislocations are deflected in the first semiconductor layer 121 and therefore do not reach the light-emitting layer 14.

The second advantage is enhanced planarity of the growth surface of the multilayer body 120. The reason the inventors believe is that In functions as a surfactant for the growth surface of the multilayer body 120 during the growth of the first semiconductor layer 121 (surfactant is a collective term for things that modify the physical or chemical properties of the growth surface of the multilayer body 120). Enhanced planarity of the growth surface of the multilayer body 120 combined with fewer dislocations extending toward the light-emitting layer 14 would lead to even higher crystal quality of the light-emitting layer 14 and, therefore, further improved light-emitting characteristics of the nitride semiconductor light-emitting element 1.

When the first semiconductor layer 121 contains In, the In composition of the first semiconductor layer 121 is preferably lower than that of the light-emitting layer 14, more preferably 0.05 or less, even more preferably about 0.04.

The multilayer body 120 preferably has two or more stacks of first and second semiconductor layers 121 and 122. This ensures that luminous efficiency remains even higher during high-temperature or high-rate driving. More preferably, the multilayer body 120 has three to seven stacks of first and second semiconductor layers 121 and 122. This enhances the luminous efficiency of the nitride semiconductor light-emitting element 1 and productivity in the manufacture thereof.

An example of a multilayer body 120 is composed of five stacks of an n-type InGaN layer (first semiconductor layer) having a thickness $t_1$ of 12 nm and an n-type GaN layer (second semiconductor layer) having a thickness $t_2$ of 12 nm on the top surface of the first n-type buffer layer 10. In this example, the thicknesses $t_1$ and $t_2$ of the first and second semiconductor layers 121 and 122 are equal across all five stacks. However, the thicknesses $t_1$ and $t_2$ of the first and second semiconductor layers 121 and 122 may vary from stack to stack within the range of 10 nm to 30 nm or, in applications in which luminous efficiency at room temperature is a high priority, on the condition that the thicknesses $t_1$ and $t_2$ of the first and second semiconductor layers 121 and 122 fall within the ranges of 10 nm to 30 nm and 10 nm to 40 nm, respectively.

The above description mainly discusses a multilayer body 120 formed by one or more stacks of first and second semiconductor layers 121 and 122. The multilayer body 120 may, however, be formed by three-layer stack(s) having a layer different from the first and second semiconductor layers 121 and 122. For example, the multilayer body 120 can be formed by one or more three-layer stacks having a 12-nm thick n-type InGaN layer (first semiconductor layer), a 12-nm thick n-type GaN layer (second semiconductor layer), and a third semiconductor layer in which the In level is between those of the n-type InGaN and n-type GaN layers. Alternatively, the multilayer body 120 may be one in which only particular structural units are three-layer stacks. The third semiconductor layer may be thinner than the first and second semiconductor layers. For the composition and impurity concentration of the third semiconductor layer, the same applies as to the compositions and impurity concentrations of the first and second semiconductor layers.

On the multilayer body 120 there is a light-emitting layer 14. The light-emitting layer 14 preferably lies in contact with the multilayer body 120, and in that case, the second semiconductor layer 122 in the multilayer body 120 closest to the light-emitting layer 14 is in contact with the light-emitting layer 14. This simplifies the process of growing the nitride semiconductor layers, thereby making this process more controllable. As a result, the yield of production of the nitride semiconductor light-emitting element 1 is improved.

<Second N-Type Buffer Layer>

A second n-type buffer layer 13 provided between the multilayer body 120 and the light-emitting layer 14 would offer the following advantages. However, the influence of providing the second n-type buffer layer 13 is considered not very great since the thickness of the second n-type buffer layer 13 is similar to that of the first or second semiconductor layer 121 or 122 (preferably, 30 nm or less).

(Case 1) Band-Gap Energy of the Second n-Type Buffer Layer 13 is Equal to or Greater than that of the Second Semiconductor Layer 122

In this case, the great band-gap energy immediately under the light-emitting layer 14 prevents holes from leaking out. This case is therefore advantageous to light-emitting elements in which hole leakage is likely (e.g., light-emitting elements with short emission wavelengths, such as near-ultraviolet or ultraviolet light-emitting elements). However, the drive voltage Vf tends to be high because of the high barrier.

(Case 2) Band-Gap Energy of the Second n-Type Buffer Layer 13 is Equal to or Smaller than that of the First Semiconductor Layer 121

In this case, the small band-gap energy immediately under the light-emitting layer 14 leads to more efficient injection of electrons into the light-emitting layer 14 and therefore a reduced drive voltage Vf. Increasing the In content of the second n-type buffer layer 13, which leads to a lower band-gap energy of the second n-type buffer layer 13, makes the crystallographic surface of the second n-type buffer layer 13 even smoother, thereby enhancing the luminous efficiency of the light-emitting layer 14 to some extent. In the second n-type buffer layer 13, however, the increased stress can cause new defects to be generated. The margin of production of the second n-type buffer layer 13 thus tends to be small.

(Case 3) Band-Gap Energy of the Second n-Type Buffer Layer 13 is Smaller than that of the Second Semiconductor Layer 122 and Greater than that of the First Semiconductor Layer 121

The structure in case 3, which is an intermediate of those in cases 1 and 2, helps in ensuring a balance between the characteristics of the nitride semiconductor light-emitting element 1 and the margin of production of the second n-type buffer layer 13.

Figure 4:
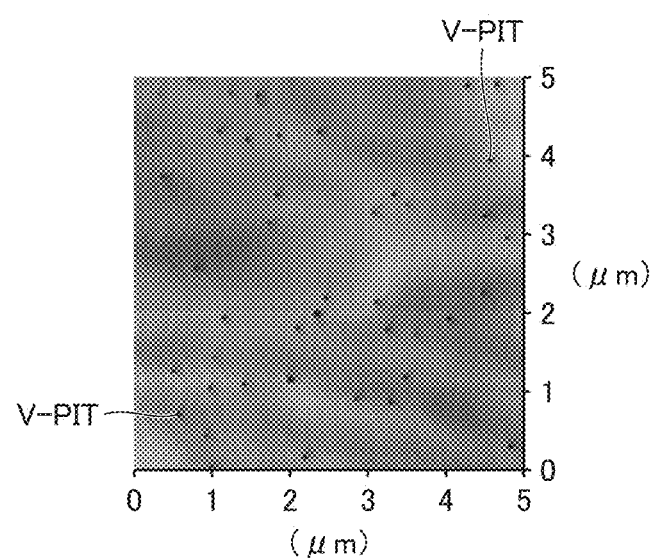
FIG. 4 is an AFM (Atomic Force Microscopy) image of a nitride semiconductor light-emitting element according to an embodiment of the present invention observed immediately before the formation of its light-emitting layer.

In the optimization of the structure of the multilayer body 120, the inventors used AFM images of the wafer surface taken immediately before forming the light-emitting layer 14 (see FIG. 4) as a guide. If there was a second n-type buffer layer 13, an AFM image of the growth surface of the second n-type buffer layer 13 served as a guide. If there was no second n-type buffer layer 13, an AFM image of the growth surface of the multilayer body 120 served as a guide. The pattern of black hexagons seen in FIG. 4 is what is called V-pits. The inventors assume that dislocations extending from the layers on the substrate 3 side with respect to the first n-type buffer layer 10 toward the first n-type buffer layer 10 emerged as visible hexagonal pyramidal cavities through the first n-type buffer layer 10, the multilayer body 120, and the second n-type buffer layer 13. The lower the density of the V-pits the better. Preferably, the density of the V-pits is $3 \times 10^8$ cm$^{-2}$ or less, more preferably $0.8 \times 10^8$ cm$^{-2}$ or less.

In improving the light-emitting characteristics or yield of the nitride semiconductor light-emitting element 1, the size of the V-pits is important. The optimum size of the V-pits varies according to the conditions under which the light-emitting layer 14 is formed or under which the p-type nitride semiconductor layers 16, 17, and 18 are formed, and is always difficult to determine. In general, the size of the V-pits increases proportionally to the thickness of the first n-type buffer layer 10, the multilayer body 120, or the second n-type buffer layer 13. If the light-emitting layer 14 and the p-type nitride semiconductor layers 16, 17, and 18 are formed under fixed conditions, the size of the V-pits can be controlled by changing the number of layers in the multilayer body 120 (e.g., the numbers of first and second semiconductor layers 121 and 122). The size of the V-pits also mainly depends on the conditions under which the multilayer body 120 is grown. In the present invention, the size of the V-pits is controlled to 70 nm to 100 nm as measured immediately before the formation of the light-emitting layer 14.

Such a second n-type buffer layer 13 is preferably an $Al_{x3}In_{y3}Ga_{1-x3-y3}N$ ($0 \leq x3 < 1$ and $0 \leq y3 < 1$) layer, more preferably an $Al_{x3}In_{y3}Ga_{1-x3-y3}N$ ($0 \leq x3 \leq 0.1$ and $0 \leq y3 \leq 0.2$) layer.

The n-type impurity concentration of the second n-type buffer layer 13 is preferably $3 \times 10^{18}$ cm$^{-3}$ or more and less than $1.1 \times 10^{19}$ cm$^{-3}$. Too high an n-type impurity concentration of the second n-type buffer layer 13 can cause low luminous efficiency at the light-emitting layer 14, which is formed on the second n-type buffer layer 13. In light of this, it is preferred that the first n-type buffer layer 10 have an n-type impurity concentration equal to that of the first or second semiconductor layer 121 or 122 as a component of the multilayer body 120.

"The second n-type buffer layer 10 has an n-type impurity concentration equal to that of the first semiconductor layer 121 as a component of the multilayer body 120" includes cases in which the n-type impurity concentration of the second n-type buffer layer 13 is 0.85 times or more and 1.15 times or less that of the first semiconductor layer 121. "The second n-type buffer layer 13 has an n-type impurity concentration equal to that of the second semiconductor layer 122 as a component of the multilayer body 120" includes cases in which the n-type impurity concentration of the second n-type buffer layer 13 is 0.85 times or more and 1.15 times or less that of the second semiconductor layer 122.

Figure 10:
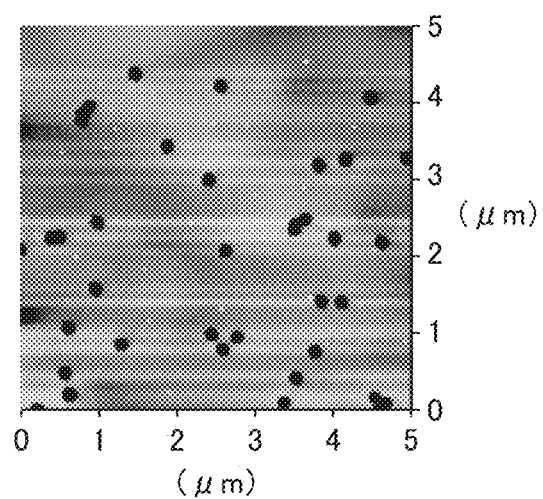
FIG. 10 is an AFM (Atomic Force Microscopy) image of a nitride semiconductor light-emitting element according to another embodiment of the present invention, developed with a focus on room-temperature characteristics, observed immediately before the formation of its light-emitting layer.

The AFM image in FIG. 4 is from a combination of an $In_{0.04}Ga_{0.96}N$ layer with $t_1=12$ nm and a GaN layer with $t_2=12$ nm. This structure was found to be suitable for LEDs focused on good thermal characteristics but not ideal for LEDs focused on room-temperature characteristics. The AFM image in FIG. 10 is from a structure composed of four pairs of $In_{0.04}Ga_{0.96}N$ layers with $t_1=12$ nm and GaN layers with $t_2=30$ nm and is an AFM observation of the wafer surface taken immediately before forming the light-emitting layer 14. This light-emitting element also had a 60-nm GaN layer and a 12-nm InGaN layer as the first and second n-type buffer layers 10 and 13, respectively, and the first n-type buffer layer 10, the multilayer body 120, and the second n-type buffer layer 13 were all doped with Si at $7 \times 10^{18}$/cm$^3$. The V-pits in FIG. 10 are approximately 200 nm across, large compared with those in FIG. 4. The density of approximately $1.5 \times 10^8$/cm$^2$ is slightly lower than that in FIG. 4 but the inventors believe falls within the range of variations at the point of measurement. Regarding the planarity of the plane, almost equally spaced smooth lines run winding up and down in the drawing like those in FIG. 4, indicating that a clear step-growth surface was formed.

As discussed hereinafter, for LEDs focused on characteristics at room temperature, it is preferred that the crystal surface on which the active layer is to be formed have such relatively large V-pits. V-pits with sizes of approximately 100 nm to 300 nm, preferably 150 nm to 250 nm, are suitable. Although relating to the structure of the active layer to be formed, too, there is an optimum size of V-pits for improved optical power. This has not been fully explained. The inventors presume that when the V-pits are small, hole injection from V-pit sidewalls into the quantum well layers in the flat portion is sufficiently unlikely, and when the V-pits are large, the associated irregularity of the crystal growth surface degrades the crystallinity of well layers and affects light-emitting characteristics.

For LEDs focused on characteristics at room temperature, it is preferred that the V-pits reach the multilayer body at the bottom of the V-shape thereof (the bottom of the V-pits before the growth of the light-emitting layer, i.e., the V-pits on the surface of the grown second n-type buffer layer 13; corresponding to the lower apexes of the V-shaped areas of the light-emitting layer in cross-sectional view of the completed epilayers). For LEDs focused on characteristics at room temperature, it is preferred that the V-pits be present as a large number of scattered cavities in plan view of the top portion of the light-emitting layer with the plane surface density of the V-pits (V-pit density) being $1\times10^8/cm^2$ or more. When the LED is focused on room temperature characteristics, the V-pit density need not be low and may be higher. Even V-pit densities roughly five times higher than that in FIG. 10 provide sufficiently efficient LEDs.

<Light-Emitting Layer>

If there is a second n-type buffer layer 13, the light-emitting layer 14 lies in contact with the second n-type buffer layer 13. Specifically, the initial well layer 14WI is in contact with the second n-type buffer layer 13. If there is no second n-type buffer layer 13, the light-emitting layer 14 lies in contact with the multilayer body 120. Specifically, the initial well layer 14WI is in contact with the (uppermost) second semiconductor layer 122 of the multilayer body 120.

The light-emitting layer 14 may have the single quantum well structure, but preferably has the multiple quantum well structure, a structure in which well layers 14W are stacked alternately with barrier layers 14A (e.g., see FIG. 5). The light-emitting layer 14 may have a layered structure in which a well layer 14W, a barrier layer 14A, and one or more semiconductor layers different from the well and barrier layers 14W and 14A are stacked in order.

The light-emitting layer 14 is preferably an undoped layer. This effectively prevents the occurrence of new defects in the light-emitting layer 14. Although not for sure, the inventors assume this can be explained by a decrease in the strain the multilayer body 120 puts on the light-emitting layer 14. "The light-emitting layer 14 is an undoped layer" means that none of the initial well layer 14WI, the well layers 14W, the final well layer 14WF, and all barrier layers 14A in the light-emitting layer 14 is intentionally doped with an n-type or p-type impurity. In these layers, the n-type impurity concentration is $1\times10^{17}$ cm$^{-3}$ or less, and the p-type impurity concentration is $1\times10^{17}$ cm$^{-3}$ or less.

During the growth of the p-type nitride semiconductor layers 16, 17, and 18, the p-type impurity may be doped out of the p-type nitride semiconductor layers 16, 17, and 18 into the well or barrier layers 14A on the p-type nitride semiconductor layer 16 side through thermal diffusion.

In the light-emitting layer 14, it is preferred that the thickness of a stack of one well layer 14W and one barrier layer 14A (total thickness of the well layer 14W and the barrier layer 14A) be 5 nm or more and 100 nm or less.

(Well Layers)

The well layers 14W are formed of a Group III nitride semiconductor that preferably has a composition adjusted according to the emission wavelength required of the nitride semiconductor light-emitting element 1, more preferably $Al_cGa_dIn_{1-c-d}N$ ($0 \le c < 1$ and $0 < d \le 1$). Al-free compositions $In_eGa_{1-e}N$ ($0 < e \le 1$) can also be used. For the emission of, for example, ultraviolet light, or light of wavelengths of 375 nm or less, it is preferred that the well layers 14W contain Al because the band-gap energy of the well layers 14W needs to be large.

The well layers on the p-type nitride semiconductor layer 16 side are preferably as impurity-free as possible. In other words, it is preferred to avoid introducing impurity raw materials during the growth of the well layers on the p-type nitride semiconductor layer 16 side. This increases the luminous efficiency of the nitride semiconductor light-emitting element 1 by making nonradiative recombination less likely in the well layers on the p-type nitride semiconductor layer 16 side. The well layers on the multilayer body 120 side preferably contain an n-type impurity. This reduces the drive voltage of the nitride semiconductor light-emitting element 1.

The well layers 14W are preferably formed of a common composition of Group III nitride semiconductor and preferably have equal thicknesses. This ensures that the well layers 14W have equal quantum levels and therefore emit light of the same wavelength through electron-hole recombination. As a result, the nitride semiconductor light-emitting element 1 has a narrow emission spectrum.

Intentionally forming the well layers 14W from varying compositions of Group III nitride semiconductors or giving varying thicknesses to the well layers 14W makes the emission spectrum of the nitride semiconductor light-emitting element 1 broad. When the nitride semiconductor light-emitting element 1 is used for purposes such as lighting, it is preferred that the emission spectrum of the nitride semiconductor light-emitting element 1 be broad, and, therefore, it is preferred to form the well layers 14W from varying compositions of Group III nitride semiconductors or give varying thicknesses to the well layers 14W intentionally. For example, it is preferred to select appropriate thicknesses of 1 nm or more and 7 nm or less for the well layers 14W. This also offers another advantage: the luminous efficiency of the nitride semiconductor light-emitting element 1 remains high. The thickness of the initial well layer 14WI is preferably 1 nm or more and 10 nm or less.

The number of well layers 14W in the multilayer body 120 is preferably 2 or more and 20 or less, more preferably 3 or more and 15 or less, even more preferably 4 or more and 12 or less.

(Barrier Layers)

The barrier layers 14A have a greater band-gap energy than the well layers 14W. Specifically, the barrier layers 14A may be $Al_fGa_gIn_{1-f-g}N$ ($0 \le f < 1$ and $0 < g \le 1$) layers or Al-free, $In_hGa_{1-h}N$ ($0 \le h \le 1$ and $e > h$) layers. However, it is preferred that the barrier layers 14A be $Al_fGa_gIn_{1-f-g}N$ ($0 \le f < 1$ and $0 < g \le 1$) layers because $Al_fGa_gIn_{1-f-g}N$ ($0 \le f < 1$ and $0 < g \le 1$) has lattice constants substantially the same as those of the material that forms the well layers 14W.

More preferably, the barrier layers 14A are $Al_fIn_gGa_{1-f-g}N$ ($0 \le f \le 0.01$ and $0 \le g \le 0.01$) layers. This effectively prevents the occurrence of new defects in the light-emitting layer 14 by reducing the strain the multilayer body 120 puts on the light-emitting layer 14. As a result, the light-emitting characteristics of the light-emitting layer 14 is improved.

Each barrier layer 14A can have any thickness, but preferably 1 nm or more and 10 nm or less, more preferably 3 nm or more and 7 nm or less. The drive voltage of the nitride semiconductor light-emitting element 1 decreases with smaller thickness of each barrier layer 14A. However, barrier layers 14A each having a thickness of less than 1 nm tend to result in low luminous efficiency of the nitride semiconductor light-emitting element 1.

Each barrier layer 14A can have any n-type impurity concentration, and it is preferred to select an appropriate level as necessary. Each barrier layer 14A may be an undoped layer, or may alternatively contain an n-type impurity. The barrier layers 14A on the multilayer body 120 side preferably contain an n-type impurity. The barrier layers 14A on the p-type nitride semiconductor layer 16 side preferably contain a lower level of n-type impurity than those on the multilayer body 120 side or are not intentionally doped with an n-type impurity.

In LEDs focused on characteristics at room temperature, the barrier layers 14A tend to be thick compared with those in LEDs focused on thermal characteristics, preferably having a thickness of 4 nm or more and 15 nm or less, more preferably 6 nm or more and 13 nm or less. It has generally been speculated that when characteristics at room temperature is a high priority, hole injection occurs through the sidewalls of the V-pits into the well layers. It therefore appears that this is because even thick barrier layers are unlikely to interfere with hole injection since their thickness relative to the sidewalls of the V-pits is thin compared with that in the flat portion. Thicker barrier layers are considered more advantageous in that they improve the crystallinity of the well layers.

<P-Side Intermediate Layer>

The final well layer 14WF preferably has the p-type nitride semiconductor layer 16 with a p-side intermediate layer (e.g., the layer 145 in FIG. 5) therebetween. This prevents, during the growth of the p-type nitride semiconductor layers 16, 17, and 18, the p-type impurity from being doped out of the p-type nitride semiconductor layers 16, 17, and 18 into the light-emitting layer 14 through thermal diffusion. It is thus preferred that the thickness of the p-side intermediate layer be such that p-type impurity does not diffuse to the final well layer 14WF, preferably less than 10 nm, more preferably less than 5 nm. The thickness of the p-side intermediate layer may be similar to that of the barrier layers 14A.

At least part of the p-side intermediate layer may be doped with an n-type impurity. This improves the luminous efficiency of the nitride semiconductor light-emitting element 1.

The p-side intermediate layer is preferably an $Al_{s5}Ga_{1-s5}N$ ($0 \le s5 < 1$) layer, more preferably a GaN layer or an AlGaN layer that has an Al composition similar to or greater than that of the barrier layers 14A. In fact, the p-type impurity diffuses from the p-type nitride semiconductor layer 16 to the p-side intermediate layer but does not diffuse near the interface between the p-side intermediate layer and the final well layer 14WF.

In LEDs focused on characteristics at room temperature, the p-side intermediate layer 145 tends to be thick compared to that in LEDs focused on thermal characteristics, preferably having a thickness of 4 nm or more and 15 nm or less, more preferably 6 nm or more and 13 nm or less. This is the same reason described regarding the barrier layers 14A.

<P-Type Nitride Semiconductor Layers>

The p-type nitride semiconductor layers 16, 17, and 18 are provided on the light-emitting layer 14 in order. The number of p-type nitride semiconductor layers is not limited to three; it may be two or less, and it may also be four or more. The p-type nitride semiconductor layers 16, 17, and 18 are preferably p-doped $Al_{s6}Ga_{t6}In_{u6}N$ ($0 \le s6 \le 1$, $0 \le t6 \le 1$, $0 \le u6 \le 1$, and $s6+t6+u6 \ne 0$) layers, p-doped $Al_{s6}Ga_{1-s6}N$ ($0 < s6 \le 0.4$, preferably $0.1 \le s6 \le 0.3$) layers. For example, the p-type nitride semiconductor layer 16 is a p-type AlGaN layer, the p-type nitride semiconductor layer 17 is a p-type GaN layer, and the p-type nitride semiconductor layer 18 is a p-type GaN layer that has a p-type impurity concentration higher than that of the p-type nitride semiconductor layer 17.

The p-type impurity can be of any kind, preferably Mg for example. The carrier concentrations in the p-type nitride semiconductor layers 16, 17, and 18 are preferably $1 \times 10^{17}$ cm$^{-3}$ or more. The p-type impurity concentrations (different from the carrier concentrations) of the p-type nitride semiconductor layers 16, 17, and 18 are preferably $1 \times 10^{19}$ cm$^{-3}$ or more because the activity of the p-type impurity is approximately 0.01. On the light-emitting layer 14 side of the p-type nitride semiconductor layer 16, the p-type impurity concentration may be less $1 \times 10^{19}$ cm$^{-3}$.

The total thickness of the p-type nitride semiconductor layers 16, 17, and 18 is not critical and preferably is 30 nm or more and 300 nm or less. Thin p-type semiconductor layers 16, 17, and 18 prevent the p-type impurity from diffusing into the light-emitting layer 14 during their growth because they need only short periods of heating to grow.

<N-Side Electrode, Transparent Electrode, and P-Side Electrode>

The n-side electrode 21 and the p-side electrode 25 are used to supply drive power to the nitride semiconductor light-emitting element 1. FIG. 2 illustrates a configuration of the n-side and p-side electrodes 21 and 25 in which a pad electrode portion alone serves as an electrode. However, elongated protrusions (branch electrodes) for the diffusion of current may be connected to the n-side and p-side electrodes 21 and 25 illustrated in FIG. 2. Under the p-side electrode 25 there is preferably an insulating layer for preventing current from being injected into the p-side electrode 25. This prevents the light emitted by the light-emitting layer 14 from being blocked by the p-side electrode 25.

The n-side electrode 21 preferably has a layered structure in which titanium, aluminum, and gold layers, for example, are stacked in this order. It is preferred that the thickness of the n-side electrode 21 be 1 μm or more assuming that the n-side electrode 21 may be used for wire bonding in some cases.

The p-side electrode 25 preferably has a layered structure in which nickel, aluminum, titanium, and gold layers, for example, are stacked in this order, but may be made of the same material(s) as the n-side electrode 21. It is preferred that the thickness of the p-side electrode 25 be 1 μm or more assuming that the p-side electrode 25 may be used for wire bonding in some cases.

The transparent electrode 31 is preferably made of a transparent conductive material, such as ITO (Indium Tin Oxide) or IZO (Indium Zinc Oxide), and preferably has a thickness of 20 nm or more and 200 nm or less.

<Production of the Nitride Semiconductor Light-Emitting Element>

The following describes an example of a method for the production of the nitride semiconductor light-emitting element 1. In the following, a "growth temperature" refers to the temperature of the substrate 3 at which the layer is crystallographically grown.

(Growth of an Underlying Layer)

After a buffer layer 5 is formed on the top surface of a substrate 3 by, for example, sputtering, an underlying layer 7 is formed on the top surface of the buffer layer 5 by, for example, MOCVD (Metal Organic Chemical Vapor Deposition).

Specifically, an underlying layer 7 is grown on the substrate 3 with the buffer layer 5 thereon in an MOCVD system, preferably at 800° C. or more and 1250° C. or less, more preferably at 900° C. or more and 1150° C. or less. This ensures the resulting underlying layer 7 has few crystallographic defects and superior crystal quality. The underlying layer 7 is preferably an undoped layer and is preferably grown to a thickness of approximately 2 to 5 µm.

(Growth of an N-Type Contact Layer)

An n-type contact layer 8 is then formed on the top surface of the underlying layer 7 by, for example, MOCVD. Specifically, an n-type contact layer 8 is grown in the MOCVD system, preferably at 800° C. or more and 1250° C. or less, more preferably at 900° C. or more and 1150° C. or less. This ensures the resulting n-type contact layer 8 has few crystallographic defects and superior crystal quality. The reactant gas contains, for example, silane gas ($SiH_4$), and the amount of silane gas is preferably adjusted to make the Si level approximately $1\times10^{19}/cm^3$. It is preferred that the n-type contact layer 8 be grown to a thickness of approximately 1 to 4 µm.

(Growth of a First N-Type Buffer Layer)

A first n-type buffer layer 10 is then formed on the top surface of the n-type contact layer 8 by, for example, MOCVD. Specifically, after the temperature inside of the MOCVD system is lowered, a first n-type buffer layer 10 is grown with the growth rate controlled to a slower speed.

Alternatively, the substrate 3 on which the n-type contact layer 8 and all lower layers have been formed may be taken out of a first MOCVD system, exposed to atmospheric air, and then put into a second MOCVD system for the formation of the first n-type buffer layer 10 and subsequent layers. In this approach, the system for growing the underlying and n-type contact layers 7 and 8, which are thick layers (requiring fast growth), can be different from that for growing the light-emitting layer 14 (requiring slow growth and growth with high uniformity in crystal quality). The manufacturer can therefore select the most suitable film formation system for the growth of each layer, and this improves efficiency in the production of the nitride semiconductor light-emitting element 1.

Specifically, the growth temperature for the first n-type buffer layer 10 is preferably 950° C. or less, more preferably 700° C. or more, even more preferably 750° C. or more. A growth temperature for the first n-type buffer layer 10 of 700° C. or more ensures that luminous efficiency remains high at the light-emitting layer 14.

(Growth of a Multilayer Body)

A multilayer body 120 is then formed on the top surface of the first n-type buffer layer 10 by, for example, MOCVD. The growth temperature for the multilayer body 120 is preferably equal to or lower than that for the first n-type buffer layer 10.

For high and sustained film quality of the multilayer body 120, it is more preferred that the growth temperature for the multilayer body 120 be 600° C. or more, even more preferably 700° C. or more. The first n-type buffer layer 10 and the multilayer body 120 may be grown at equal growth temperatures.

(Growth of a Second N-Type Buffer Layer)

A second n-type buffer layer 13 can be grown under the same conditions as in the formation of the multilayer body 12, except for the composition of gases supplied to the MOCVD system.

(Growth of a Light-Emitting Layer and P-Type Nitride Semiconductor Layers)

A light-emitting layer 14 and p-type nitride semiconductor layers 16, 17, and 18 are then formed on the top surface of the multilayer body 120 in order following known methods.

The following raw-material gases can be used in the MOCVD crystallographic growth of layers. The Ga raw-material gas can be TMG (trimethylgallium) or TEG (triethylgallium). The Al raw-material gas can be TMA (trimethylaluminum) or TEA (triethylaluminum). The In raw-material gas can be TMI (trimethylindium) or TEI (triethyindium). The N raw-material gas can be $NH_3$ or $DMH_y$ (dimethylhydrazine). The raw-material gas for Si as an n-type impurity can be $SiH_4$, $Si_2H_6$, or organic silicon. The raw-material gas for Mg as a p-type impurity can be $Cp_2Mg$.

(Etching and Formation of Electrodes)

The following layers are then etched to expose part of the n-type contact layer 8: the p-type nitride semiconductor layers 16, 17, and 18, the light-emitting layer 14, the second n-type buffer layer 13, the multilayer body 120, the first n-type buffer layer 10, and the n-type contact layer 8. An n-side electrode 21 is formed on the top surface of the n-type contact layer 8 exposed through this process of etching, and a transparent electrode 23 and a p-side electrode 25 are formed on the top surface of the p-type nitride semiconductor layer 18 in order. Then a transparent protection film 27 is formed to cover the transparent electrode 23 and the sides of the layers exposed through the above etching process. In this way, a nitride semiconductor light-emitting element 1 is obtained.

The substrate 3 may be removed. The time when to remove the substrate 3 is not critical. For example, when two or more MOCVD systems are used to grow the nitride semiconductor layers, the substrate 3 can be removed between taking the substrate 3 out of a first MOCVD system and putting it into a second MOCVD system.

It is also possible to grow the underlying, n-type contact, and first n-type contact layers 7, 8, and 10 in a first MOCVD system and the multilayer body 120 and subsequent layers in a second MOCVD system. However, growing the underlying and n-type contact layers 7 and 8 in a first MOCVD system and the first n-type buffer layer 10, the multilayer body 120, and subsequent layers in a second MOCVD system would improve the throughput of the second MOCVD system.

<Overall Summary of Embodiments>

The nitride semiconductor light-emitting element 1 in FIG. 1 includes at least an n-type nitride semiconductor layer 8, a light-emitting layer 14, and p-type nitride semiconductor layers 16, 17, and 18. A multilayer body 120 is provided between the n-type nitride semiconductor layer 8 and the light-emitting layer 14, and the multilayer body 120 has at least one stack of first and second semiconductor layers 121 and 122. The second semiconductor layer 122 has a greater band-gap energy than the first semiconductor layer 121. Each of the first and second semiconductor layers 121 and 122 has a thickness of more than 10 nm and 30 nm or less. This further improves the light-emitting characteristics of the nitride semiconductor light-emitting element 1.

Figure 11:
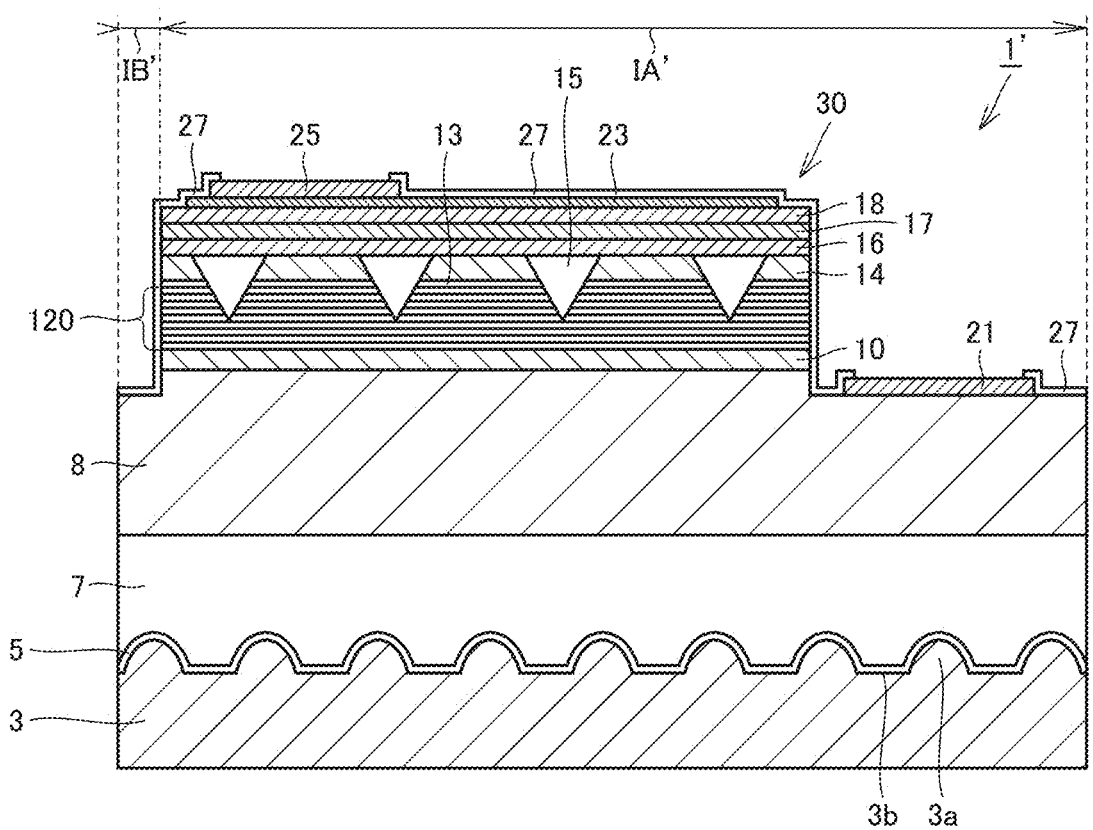
FIG. 11 is a cross-section of a room temperature characteristics-oriented nitride semiconductor light-emitting element according to this embodiment of the present invention.

The room temperature characteristics-oriented nitride semiconductor light-emitting element 1' in FIG. 11 has a great difference from that in FIG. 1, a more dense population of large-sized V-pits 15. The first semiconductor layer 121 has a thickness of more than 10 nm and 30 nm or less. The second semiconductor layer 122 has a thickness of more than 10 nm and 40 nm or less. This further improves the light-emitting characteristics of the room temperature characteristics-oriented nitride semiconductor light-emitting element 1'.

The first semiconductor layer 121 is preferably an $Al_{x1}In_{y1}Ga_{1-x1-y1}N$ ($0 \le x1 < 1$ and $0 < y1 \le 1$) layer, and the second semiconductor layer 122 is preferably an $Al_{x2}In_{y2}Ga_{1-x2-y2}N$ ($0 \le x2 < 1$ and $0 \le y2 < 1$) layer.

Each of the first and second semiconductor layers 121 and 122 preferably has an n-type impurity concentration of $3 \times 10^{18}$ cm$^{-3}$ or more and less than $1.1 \times 10^{19}$ cm$^{-3}$. This further reduces the density of threading dislocations in the light-emitting layer 14.

The first and second semiconductor layers 121 and 122 preferably have equal n-type impurity concentrations. This helps in controlling the compositions or thicknesses of the first and second semiconductor layers 121 and 122.

The first and second semiconductor layers 121 and 122 preferably have equal thicknesses. This further enhances the crystal quality of the light-emitting layer 14.

The multilayer body 120 preferably has three to seven stacks of the first and second semiconductor layers 121 and 122. This enhances the luminous efficiency of the nitride semiconductor light-emitting element 1 and productivity in the manufacture thereof.

It is preferred that the second semiconductor layer 122 in the multilayer body 120 closest to the light-emitting layer 14 be in contact with the light-emitting layer 14. This improves the yield of production of the nitride semiconductor light-emitting element 1 and simplifies the process of growing the nitride semiconductor layers.

It is preferred that a second n-type buffer layer 13 be provided between the multilayer body 120 and the light-emitting layer 14. Preferably, the second n-type buffer layer 13 is an $Al_{x3}In_{y3}Ga_{1-x3-y3}N$ ($0 \le x3 < 1$ and $0 \le y3 < 1$) layer that contains an n-type impurity and lies in contact with the light-emitting layer. This improves the yield of production of the nitride semiconductor light-emitting element 1 by allowing the manufacturer to optimize the structure of the nitride semiconductor light-emitting element 1 to meet the emission wavelength or operation voltage specification.

The band-gap energy of the second n-type buffer layer 13 is preferably equal to or greater than that of the second semiconductor layer 122. This prevents holes from leaking out.

The band-gap energy of the second n-type buffer layer 13 is preferably smaller than that of the second semiconductor layer 122 and greater than that of the first semiconductor layer 121. This ensures a balance between the light-emitting characteristics of the nitride semiconductor light-emitting element 1 and the margin of production of the second n-type buffer layer 13.

The band-gap energy of the second n-type buffer layer 13 is preferably equal to or smaller than that of the first semiconductor layer 121. This leads to more efficient injection of electrons into the light-emitting layer 14.

The thickness of the second n-type buffer layer is preferably 30 nm or less. This prevents the occurrence of faults due to the presence of the second n-type buffer layer 13.

It is preferred that a first n-type buffer layer 10 be provided between the n-type nitride semiconductor layer 8 and the multilayer body 120. Preferably, the first n-type buffer layer 10 is an $Al_{s4}In_{t4}Ga_{1-s4-t4}N$ ($0 \le s4 < 1$ and $0 \le t4 < 1$) layer that contains an n-type impurity and lies in contact with the multilayer body 120. This improves the controllability of the V-pit structure.

The band-gap energy of the first n-type buffer layer 10 is preferably equal to that of the second semiconductor layer 122. This prevents the occurrence of new crystallographic defects.

The n-type impurity concentration of the first n-type buffer layer 10 is preferably equal to at least one of the n-type impurity concentrations of the first and second semiconductor layers 121 and 122. This enhances the luminous efficiency at the light-emitting layer 14.

The thickness of the first n-type buffer layer 10 is preferably 50 nm or less. This prevents a decline in the luminous efficiency of the nitride semiconductor light-emitting element 1 by limiting the waviness of the growth surface of the first n-type buffer layer 10.

The light-emitting layer 14 is preferably an undoped layer. This prevents the occurrence of new defects in the light-emitting layer 14.

The light-emitting layer 14 preferably has the single quantum well structure or a multiple quantum well structure in which well layers are stacked alternately with $Al_fIn_gGa_{1-f-g}N$ ($0 \le f \le 0.01$ and $0 \le g \le 0.01$) barrier layers. This effectively prevents the occurrence of new defects in the light-emitting layer 14.

EXAMPLES

The following describes the present invention in more detail by providing some examples. However, the present invention is not limited to these examples.

Example 1

In Example 1, nitride semiconductor light-emitting elements having the energy band diagram illustrated in FIG. 5 were produced.
(Preparation of a Substrate (Wafer))

A wafer that was a 100-mm diameter sapphire substrate was prepared. The wafer had a textured top surface formed by projections 3a alternating with recesses 3b. Such a textured profile was formed following the method presented below.

First, a mask with a two-dimensional pattern of the projections 3a in FIG. 1 (a) defined thereon was placed on the wafer. The wafer top surface was then dry-etched using this mask. Some areas were dry-etched away to leave the recesses 3b, and the other areas were not dry-etched and left as the projections 3a. That is, the projections 3a were arranged in lines in the following directions: <11-20> on the wafer top surface, +60° to <11-20> on the wafer top surface, and −60° to <11-20> on the wafer top surface. The projections 3a on the wafer top surface were at the apexes of triangles and periodically arranged along the three sides of the triangles.

The projections 3a on the wafer top surface were round in shape, with the diameter being approximately 1.2 μm. The interval between adjacent projections 3a (side length of the triangles) based on apexes was 2 μm, and the height of the projections 3a was approximately 0.6 μm. The projections 3a had the side-view shape illustrated in FIG. 1 (a), with rounded tops. The recesses 3b had the side-view shape illustrated in FIG. 1 (a).
(Formation of a Buffer Layer)

After the formation of the projections 3a and recesses 3b, the wafer top surface was subjected to an RCA clean. The RCA-cleaned wafer was put into the chamber of a reactive sputtering system, and an aluminum nitride buffer layer 5 (25-nm thick) was formed. The resulting buffer layer 5 was an aggregate of columnar crystals extending normal to the wafer top surface and uniform in grain size.

(Growth of Underlying and N-Type Contact Layers)

The wafer with the buffer layer 5 thereon was put into an MOCVD system, and an undoped GaN underlying layer 7 was crystallographically grown. The underlying layer 7 was 4.5 μm thick.

A Si-doped n-type GaN layer (n-type contact layer 8) was then crystallographically grown on the top surface of the underlying layer 7 by MOCVD. The n-type contact layer 8 was 4.5 μm thick and had an n-type impurity concentration of $1 \times 10^{19}$ cm$^{-3}$.

(Growth of a First N-Type Buffer Layer)

After the wafer temperature was lowered to 801° C., a 25-nm thick Si-doped GaN layer (first n-type buffer layer 10) was crystallographically grown by MOCVD. The crystallographically grown Si-doped GaN layer was in contact with the n-type contact layer 8 and had an n-type impurity concentration of $7.4 \times 10^{18}$ cm$^{-3}$.

(Growth of a Multilayer Body)

With the wafer temperature maintained at 801° C., a multilayer body 120 was crystallographically grown. Specifically, five stacks were formed that were each composed of a 12-nm thick Si-doped InGaN (In composition, 0.04) layer and a 12-nm thick Si-doped GaN layer with the former on the side touching the first n-type buffer layer 10. In all layers of the multilayer body 120, the n-type impurity concentration was $7.4 \times 10^{18}$ cm$^{-3}$. This structure omits the second n-type buffer layer 13.

(Growth of a Light-Emitting Layer)

The wafer temperature was lowered to 672° C. Then well layers 14W were crystallographically grown alternately with barrier layers 14A on the top surface of the multilayer body 120 to form a light-emitting layer 14.

Well layers 14W (eight layers) were crystallographically grown using nitrogen gas as carrier gas. The crystallographically grown well layers 14W, initial well layer 14WI, and final well layer 14WF were undoped $In_xGa_{1-x}N$ (x=0.20) layers. As a result, the wavelength of the photoluminescence from the well layers 14W was 448 nm. The well layers 14W and the initial well layer 14WI were each made to a thickness of 3.38 nm, and the final well layer 14WF was made to a thickness of 5.0 nm.

Barrier layers 14A (seven layers) were crystallographically grown alternately with the well layers 14W. The crystallographically grown barrier layers 14A were undoped $Al_yGa_{1-y}N$ (y=0.001) layers and were 4.0 nm thick.

(Growth of a P-Side Intermediate Layer)

An undoped AlGaN (Al composition, 0.001) p-side intermediate layer 145 (3.0-nm thick) was crystallographically grown on the top surface of the final well layer 14WF.

(Growth of P-Type Nitride Semiconductor Layers)

The wafer temperature was increased to 1000° C. Then a p-type $Al_{0.18}Ga_{0.82}N$ layer (p-type nitride semiconductor layer 16; thickness, 9 nm; p-type impurity concentration, $2 \times 10^{19}$ cm$^{-3}$), a p-type GaN layer (p-type nitride semiconductor layer 17; thickness, 20 nm; p-type impurity concentration, $3 \times 10^{19}$ cm$^{-3}$), and a p-type contact layer (p-type nitride semiconductor layer 18; thickness, 7 nm; p-type impurity concentration, $1 \times 10^{20}$ cm$^{-3}$) were crystallographically grown on the top surface of the p-side intermediate layer 145 in order.

In the crystallographic growth of these layers, the Ga raw-material gas was TMG (trimethylgallium), the Al raw-material gas was TMA (trimethylalluminum), the In raw-material gas was TMI (trimethylindium), and the N raw-material gas was NH$_3$. The raw-material gas for Si as an n-type impurity was SiH$_4$, and the raw-material gas for Mg as a p-type impurity was Cp$_2$Mg.

(Etching and Formation of Electrodes)

The wafer was taken out of the MOCVD system. The following layers were then etched to expose part of the n-type contact layer 8: the p-type contact layer, the p-type GaN layer, the p-type $Al_{0.18}Ga_{0.82}N$ layer, the p-side intermediate layer 145, the light-emitting layer 14, the multilayer body 120, the first n-type buffer layer 10, and the n-type contact layer 8. A Au n-side electrode 21 was formed on the top surface of the n-type contact layer 8 exposed through this process of etching. An ITO transparent electrode 23 and a Au p-side electrode 25 were formed on the top surface of the p-type contact layer 18 in order. A SiO$_2$ film (transparent protection film 27) was formed, primarily covering the transparent electrode 23 and the sides of the layers exposed through the above etching process. The wafer was then divided into 620×680 μm chips. In this way, nitride semiconductor light-emitting elements of this example were obtained.

A resulting nitride semiconductor light-emitting element displayed blue light emission with a dominant wavelength of 450 nm when operated at room temperature with a current of 120 mA. The optical power was 170 mW, and the voltage applied was 3.05 V. The percentage of the optical power at 80° C. to that at room temperature was 98%. A nitride semiconductor light-emitting element produced in the same way as in this example except for the omission of the multilayer body had an optical power of 161 mW, and the percentage of its optical power at 80° C. to that at room temperature was 94%. This indicates that the presence of the multilayer body improved the light-emitting characteristics of the nitride semiconductor light-emitting element.

Example 2

Figure 6:
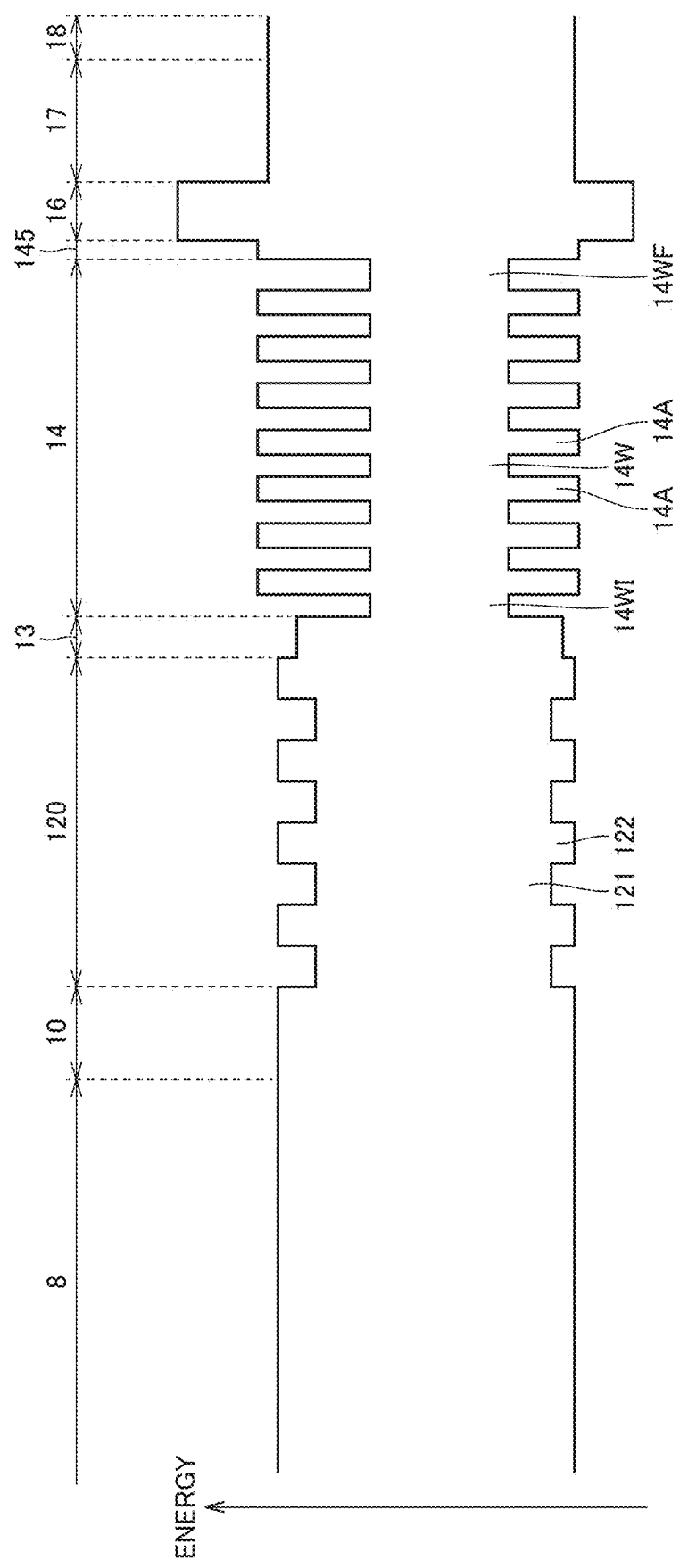
FIG. 6 is an energy band diagram that schematically illustrates the band structure of the nitride semiconductor light-emitting element according to Example 2.

In Example 2, nitride semiconductor light-emitting elements having the energy band diagram illustrated in FIG. 6 were produced. Underlying and n-type contact layers 7 and 8 were crystallographically grown in an MOCVD system following the method described in Example 1, and then the method presented below was followed to obtain nitride semiconductor light-emitting elements.

(Growth of a First N-Type Buffer Layer)

With the wafer inside the MOCVD system, the wafer temperature was lowered to 801° C. A 25-nm thick Si-doped GaN layer (first n-type buffer layer 10) was then crystallographically grown by MOCVD. The crystallographically grown Si-doped GaN layer was in contact with the n-type contact layer 8 and had an n-type impurity concentration of $7.4 \times 10^{18}$ cm$^{-3}$.

(Growth of a Multilayer Body)

With the wafer temperature maintained at 801° C., a multilayer body 120 was crystallographically grown. Specifically, four stacks were formed that were each composed of a 15-nm thick Si-doped InGaN (In composition, 0.04) layer and an 11-nm thick Si-doped GaN layer with the former on the side touching the first n-type buffer layer 10. In all layers of the multilayer body 120, the n-type impurity concentration was $7.4 \times 10^{18}$ cm$^{-3}$.

(Growth of a Second N-Type Buffer Layer)

A 12-nm thick AlInGaN (Al composition, 0.01; In composition, 0.04) layer (second n-type buffer layer 13) was crystallographically grown on the top surface of the multilayer body 120 by MOCVD. The crystallographically grown AlInGaN layer had an n-type impurity concentration of $7.4 \times 10^{18}$ cm$^{-3}$.

(Growth of a Light-Emitting Layer)

The wafer temperature was lowered to 672° C. Then well layers 14W were crystallographically grown alternately with barrier layers 14A on the top surface of the second n-type buffer layer 13 to form a light-emitting layer 14.

Well layers 14W (eight layers) were crystallographically grown using nitrogen gas as carrier gas. The crystallographically grown well layers 14W, initial well layer 14WI, and final well layer 14WF were undoped In$_x$Ga$_{1-x}$N (x=0.20) layers. As a result, the wavelength of the photoluminescence from the well layers 14W was 448 nm. The well layers 14W and the initial well layer 14WI were each made to a thickness of 3.58 nm, and the final well layer 14WF was made to a thickness of 5.0 nm.

Barrier layers 14A (seven layers) were crystallographically grown alternately with the well layers 14W. The crystallographically grown barrier layers 14A were undoped GaN layers and were 4.0 nm thick.

(Growth of a P-Side Intermediate Layer)

An undoped AlGaN (Al composition, 0.001) p-side intermediate layer 145 (3.0-nm thick) was crystallographically grown on the top surface of the final well layer 14WF.

(Growth of P-Type Nitride Semiconductor Layers, Etching, and Formation of Electrodes)

The method described in Example 1 was followed to form p-type nitride semiconductor layers 16, 17, and 18, carry out etching, form n-side, transparent, and p-side electrodes 21, 23, and 25 and a transparent protective film 27, and divide the wafer into 620×680 μm chips. In this way, nitride semiconductor light-emitting elements of this example were obtained.

A resulting nitride semiconductor light-emitting element displayed blue light emission with a dominant wavelength of 450 nm when operated at room temperature with a current of 120 mA. The optical power was 171 mW, and the voltage applied was 3.04 V. The percentage of the optical power at 80° C. to that at room temperature was 98%.

Example 3

Figure 7:
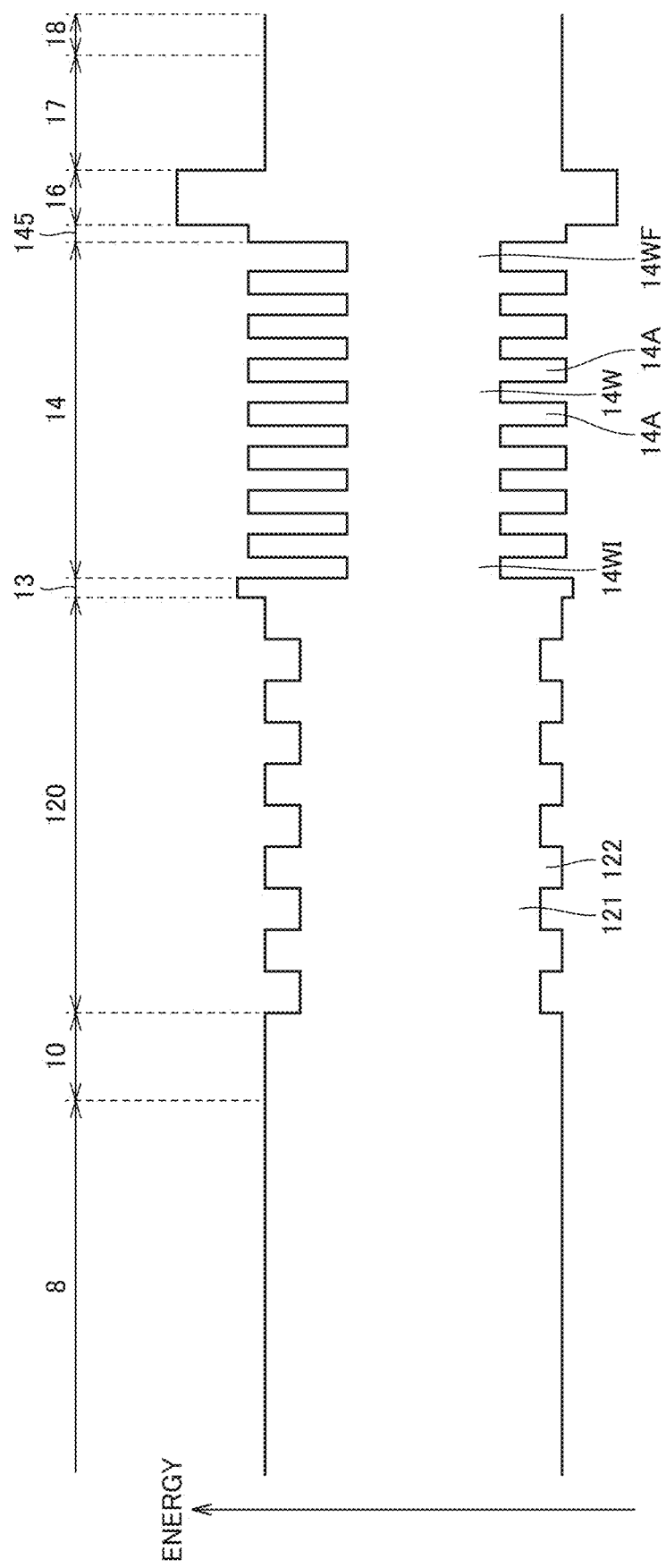
FIG. 7 is an energy band diagram that schematically illustrates the band structure of the nitride semiconductor light-emitting element according to Example 3.

In Example 3, nitride semiconductor light-emitting elements having the energy band diagram illustrated in FIG. 7 were produced. After the crystallographical growth of underlying, n-type contact, and first n-type buffer layers 7, 8, and 10 following the methods described in Examples 1 and 2, the method presented below was followed to obtain nitride semiconductor light-emitting elements.

(Growth of a Multilayer Body)

With the wafer temperature maintained at 801° C., a multilayer body 120 was crystallographically grown. Specifically, five stacks were formed that were each composed of a 12-nm thick Si-doped InGaN (In composition, 0.04) layer and a 12-nm thick Si-doped GaN layer with the former on the side touching the first n-type buffer layer 10. In all layers of the multilayer body 120, the n-type impurity concentration was $7.4 \times 10^{18}$ cm$^{-3}$.

(Growth of a Second N-Type Buffer Layer)

A 3-nm thick AlInGaN (Al composition, 0.02; In composition, 0.005) layer (second n-type buffer layer 13) was crystallographically grown on the top surface of the multilayer body 120 by MOCVD. The crystallographically grown AlInGaN layer had an n-type impurity concentration of $7.4 \times 10^{18}$ cm$^{-3}$.

(Growth of a Light-Emitting Layer)

The wafer temperature was lowered to 672° C. Then well layers 14W were crystallographically grown alternately with barrier layers 14A on the top surface of the second n-type buffer layer 13 to form a light-emitting layer 14.

Well layers 14W (eight layers) were crystallographically grown using nitrogen gas as carrier gas. The crystallographically grown well layers 14W, initial well layer 14WI, and final well layer 14WF were undoped In$_x$Ga$_{1-x}$N (x=0.20) layers. As a result, the wavelength of the photoluminescence from the well layers 14W was 448 nm. The well layers 14W and the initial well layer 14WI were each made to a thickness of 3.38 nm, and the final well layer 14WF was made to a thickness of 5.0 nm.

Barrier layers 14A (seven layers) were crystallographically grown alternately with the well layers 14W. The crystallographically grown barrier layers 14A were undoped Al$_y$Ga$_{1-y}$N (y=0.001) layers and were 4.0 nm thick.

(Growth of a P-Side Intermediate Layer)

An undoped Al$_y$Ga$_{1-y}$N (y=0.001) p-side intermediate layer 145 (3.0-nm thick) was crystallographically grown on the top surface of the final well layer 14WF.

(Growth of P-Type Nitride Semiconductor Layers, Etching, and Formation of Electrodes)

The method described in Example 1 was followed to form p-type nitride semiconductor layers 16, 17, and 18, carry out etching, form n-side, transparent, and p-side electrodes 21, 23, and 25 and a transparent protective film 27, and divide the wafer into 620×680 μm chips. In this way, nitride semiconductor light-emitting elements of this example were obtained.

A resulting nitride semiconductor light-emitting element displayed blue light emission with a dominant wavelength of 450 nm when operated at room temperature with a current of 120 mA. The optical power was 169 mW, and the voltage applied was 3.07 V. The percentage of the optical power at 80° C. to that at room temperature was 98.5%.

Example 4

Figure 8:
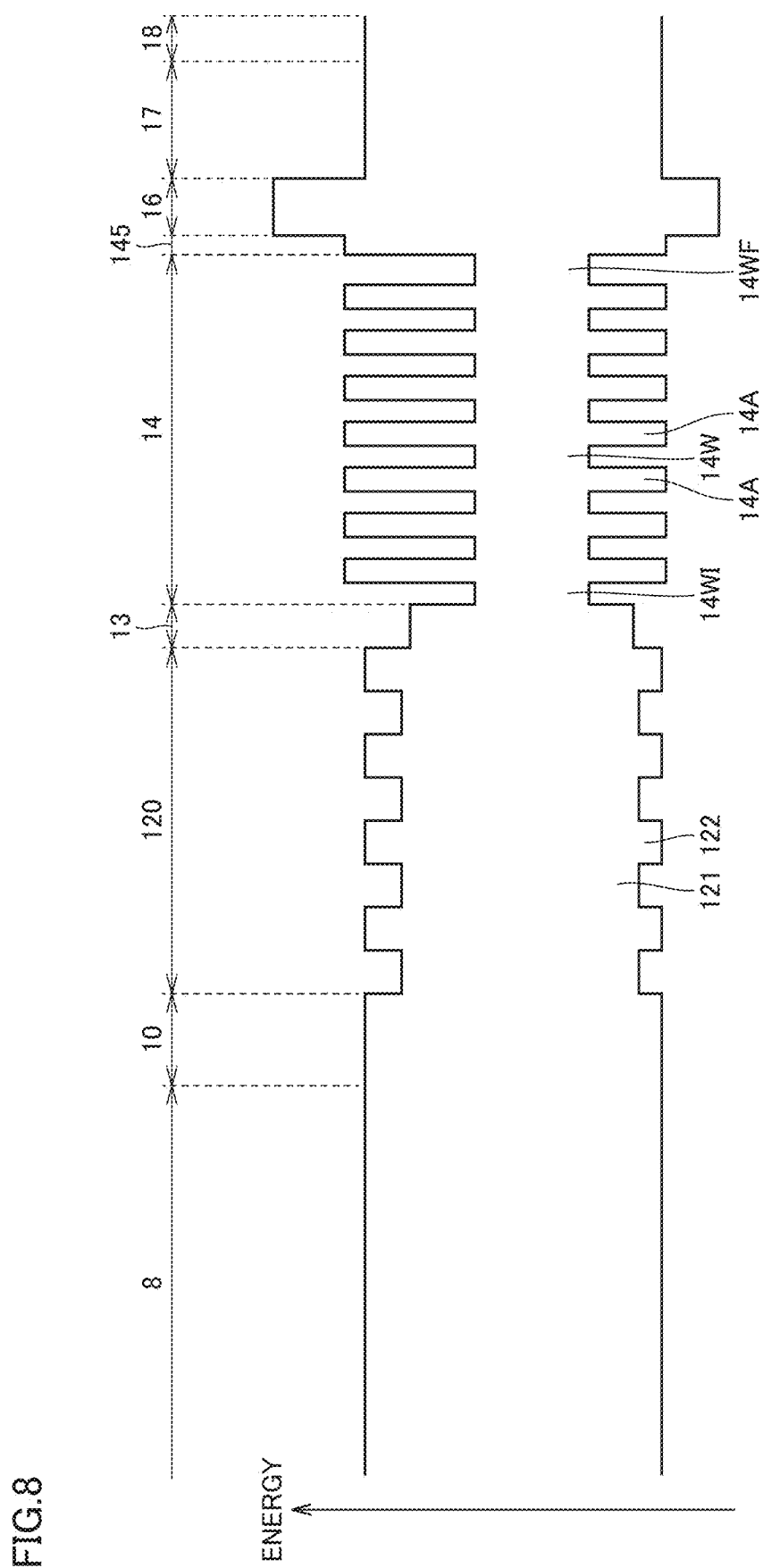
FIG. 8 is an energy band diagram that schematically illustrates the band structure of the nitride semiconductor light-emitting element according to Example 4.

In Example 4, nitride semiconductor light-emitting elements having the energy band diagram illustrated in FIG. 8 were produced. After the crystallographical growth of underlying, n-type contact, and first n-type buffer layers 7, 8, and 10 following the methods described in Examples 1 and 2, the method presented below was followed to obtain nitride semiconductor light-emitting elements.

(Growth of a Multilayer Body)

With the wafer temperature maintained at 801° C., a multilayer body 120 was crystallographically grown. Specifically, four stacks were formed that were each composed of a 12-nm thick Si-doped InGaN (In composition, 0.04) layer and a 12-nm thick Si-doped GaN layer with the former on the side touching the first n-type buffer layer 10. In all layers of the multilayer body 120, the n-type impurity concentration was $7.4 \times 10^{18}$ cm$^{-3}$.

(Growth of a Second N-Type Buffer Layer)

A 12-nm thick AlInGaN (Al composition, 0.0025; In composition, 0.042) layer (second n-type buffer layer 13) was crystallographically grown on the top surface of the multilayer body 120 by MOCVD. The crystallographically grown AlInGaN layer had an n-type impurity concentration of $7.4 \times 10^{18}$ cm$^{-3}$.

(Growth of a Light-Emitting Layer and P-Type Nitride Semiconductor Layers, Etching, and Formation of Electrodes)

A light-emitting layer 14 and a p-side intermediate layer 15 were crystallographically grown following the method described in Example 3. The method described in Example 1 was then followed to form p-type nitride semiconductor layers 16, 17, and 18, carry out etching, form n-side, transparent, and p-side electrodes 21, 23, and 25 and a transparent protective film 27, and divide the wafer into 620×680 μm chips. In this way, nitride semiconductor light-emitting elements of this example were obtained.

A resulting nitride semiconductor light-emitting element displayed blue light emission with a dominant wavelength of 450 nm when operated at room temperature with a current of 120 mA. The optical power was 170 mW, and the voltage applied was 3.02 V. The percentage of the optical power at 80° C. to that at room temperature was 97.5%.

Example 5

Figure 9:
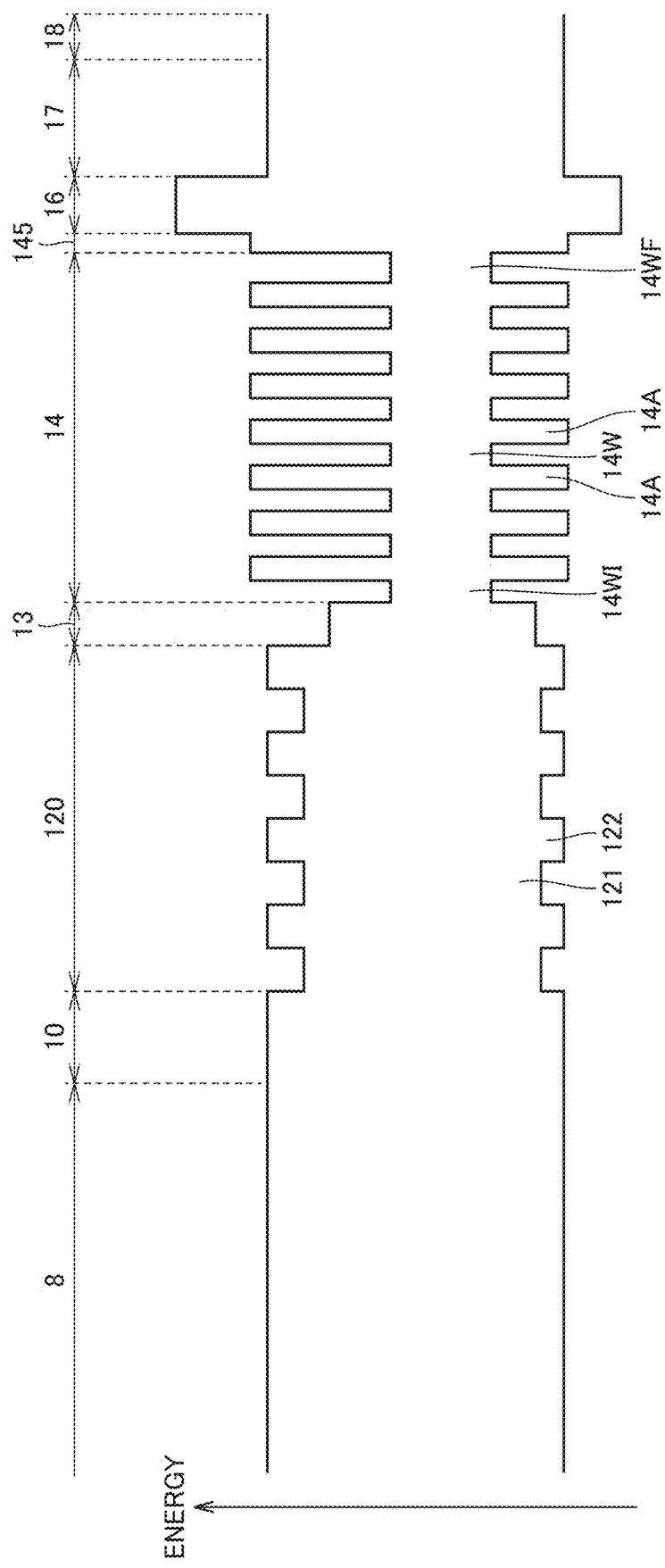
FIG. 9 is an energy band diagram that schematically illustrates the band structure of the nitride semiconductor light-emitting element according to Example 5.

In Example 5, nitride semiconductor light-emitting elements having the energy band diagram illustrated in FIG. 9 were produced. Underlying and n-type contact layers 7 and 8 were grown in a first MOCVD system. The substrate 3 was then taken out of the first MOCVD system and put into a second MOCVD system, and the first n-type buffer layer 10 and subsequent layers were grown. Specifically, the method presented below was followed to obtain nitride semiconductor light-emitting elements.
(Growth of a First N-Type Buffer Layer)

After the wafer was put into the second MOCVD system, the wafer temperature was lowered to 801° C. A 25-nm thick Si-doped GaN layer (first n-type buffer layer 10) was then crystallographically grown by MOCVD. The crystallographically grown Si-doped GaN layer was in contact with the n-type contact layer 8 and had an n-type impurity concentration of $9 \times 10^{18}$ $cm^{-3}$.
(Growth of a Multilayer Body)

With the wafer temperature maintained at 801° C., a multilayer body 120 was crystallographically grown. Specifically, four stacks were formed that were each composed of a 12-nm thick Si-doped InGaN (In composition, 0.04) layer and a 12-nm thick Si-doped GaN layer with the former on the side touching the first n-type buffer layer 10. In all layers of the multilayer body 120, the n-type impurity concentration was $7.4 \times 10^{18}$ $cm^{-3}$.
(Growth of a Second N-Type Buffer Layer)

A 12-nm thick AlInGaN (Al composition, 0.0025; In composition, 0.042) layer (second n-type buffer layer 13) was crystallographically grown on the top surface of the multilayer body 120 by MOCVD. The crystallographically grown AlInGaN layer had an n-type impurity concentration of $7.4 \times 10^{18}$ $cm^{-3}$.
(Growth of a Light-Emitting Layer and a P-Side Intermediate Layer)

After a light-emitting element 14 was crystallographically grown following the method described in Example 1, a p-side intermediate layer 145 was crystallographically grown following the method described in Example 2.
(Growth of P-Type Nitride Semiconductor Layers)

The wafer temperature was increased to 1100° C. Then a p-type $Al_{0.18}Ga_{0.82}N$ layer (p-type nitride semiconductor layer 16; thickness, 12 nm; p-type impurity concentration, $2 \times 10^{19}$ $cm^{-3}$), a p-type GaN layer (p-type nitride semiconductor layer 17; thickness, 20 nm; p-type impurity concentration, $3 \times 10^{19}$ $cm^{-3}$), and a p-type contact layer (p-type nitride semiconductor layer 18; thickness, 7 nm; p-type impurity concentration, $1 \times 10^{20}$ $cm^{-3}$) were crystallographically grown on the top surface of the p-side intermediate layer 145 in order.

(Etching and Formation of Electrodes)

The method described in Example 1 was followed to carry out etching, form n-side, transparent, and p-side electrodes 21, 23, and 25 and a transparent protective film 27, and divide the wafer into 620×680 μm chips. In this way, nitride semiconductor light-emitting elements of this example were obtained.

A resulting nitride semiconductor light-emitting element displayed blue light emission with a dominant wavelength of 450 nm when operated at room temperature with a current of 120 mA. The optical power was 170 mW, and the voltage applied was 3.05 V. The percentage of the optical power at 80° C. to that at room temperature was 98%. A nitride semiconductor light-emitting element produced in the same way as in this example except for the omission of the multilayer body had an optical power of 161 mW, and the percentage of its optical power at 80° C. to that at room temperature was 94%. This indicates that the presence of the multilayer body improved the light-emitting characteristics of the nitride semiconductor light-emitting element.

Example 6

In Example 6, nitride semiconductor light-emitting elements were produced that had an energy band diagram very similar to that in FIG. 7 but whose emission wavelength was in the near-ultraviolet region. In this example, underlying, n-type contact, and first n-type buffer layers 7, 8, and 10, a multilayer body 120, and a second n-type buffer layer 13 were crystallographically grown following the method described in Example 3, and then the method presented below was followed to produce nitride semiconductor light-emitting elements.
(Growth of a Light-Emitting Layer)

The wafer temperature was lowered to 698° C. Then well layers 14W were crystallographically grown alternately with barrier layers 14A on the top surface of the second n-type buffer layer 13 to form a light-emitting layer 14.

Well layers 14W (eight layers) were crystallographically grown using nitrogen gas as carrier gas. The crystallographically grown well layers 14W, initial well layer 14WI, and final well layer 14WF were undoped $In_xGa_{1-x}N$ (x=0.10) layers. As a result, the wavelength of the photoluminescence from the well layers 14W was 403 nm. The well layers 14W and the initial well layer 14WI were each made to a thickness of 3.38 nm, and the final well layer 14WF was made to a thickness of 5.0 nm.

Barrier layers 14A (seven layers) were crystallographically grown alternately with the well layers 14W. The crystallographically grown barrier layers 14A were undoped $Al_yGa_{1-y}N$ (y=0.05) layers and were 4.0 nm thick.
(Growth of a P-Side Intermediate Layer)

An undoped $Al_yGa_{1-y}N$ (y=0.05) p-side intermediate layer 145 (3.0-nm thick) was crystallographically grown on the top surface of the final well layer 14WF.
(Growth of P-Type Nitride Semiconductor Layers, Etching, and Formation of Electrodes)

The method described in Example 1 was followed to form p-type nitride semiconductor layers 16, 17, and 18, carry out etching, form n-side, transparent, and p-side electrodes 21, 23, and 25 and a transparent protective film 27, and divide the wafer into 440×530 μm chips. In this way, nitride semiconductor light-emitting elements of this example were obtained.

A resulting nitride semiconductor light-emitting element displayed violet light emission with a peak wavelength of 405 nm when operated at room temperature with a current of 50 mA. The optical power was 70 mW, and the voltage applied was 3.15 V. A nitride semiconductor light-emitting element produced in the same way as in this example except for the omission of the multilayer body had an optical power of 63 mW. This indicates that the presence of the multilayer body improved the light-emitting characteristics of the nitride semiconductor light-emitting element.

Example 7

In Example 7, the method described in Example 2 was followed to produce nitride semiconductor light-emitting elements except that the composition of the first n-type buffer layer 10 was different.

First, underlying and n-type contact layers 7 and 8 were crystallographically grown in an MOCVD system following the method described in Example 1. The method presented below was then followed to produce nitride semiconductor light-emitting elements.
(Growth of a First N-Type Buffer Layer)

With the wafer inside the MOCVD system, the wafer temperature was set to 796° C. A 35-nm thick Si-doped InGaN layer (first n-type buffer layer 10) was then crystallographically grown by MOCVD. The crystallographically grown Si-doped InGaN layer was in contact with the n-type contact layer 8 and had an n-type impurity concentration of $9.0 \times 10^{18}$ cm$^{-3}$.

The method described in Example 2 was followed to carry out the growth of a multilayer body 120, second n-type buffer, light-emitting, and p-side intermediate layers 13, 14, and 145, and p-type nitride semiconductor layers 16, 17, and 18, etching, and the formation of electrodes.

A resulting nitride semiconductor light-emitting element displayed blue light emission with a dominant wavelength of 450 nm when operated at room temperature with a current of 120 mA. The optical power was 171 mW, and the voltage applied was 3.04 V. The percentage of the optical power at 80° C. to that at room temperature was 98%.

Example 8

In Example 8, the method described in Example 1 was followed to produce nitride semiconductor light-emitting elements except that the n-type impurity concentration of the multilayer body was different. Some specifications for the nitride semiconductor light-emitting element may require fine tuning of operation voltage to avoid losing yield. An effective way to increase the operation voltage slightly according to the specifications for the nitride semiconductor light-emitting element is to reduce the n-type impurity concentration of one of the two layers that form the multilayer body.
(Growth of a Multilayer Body)

With the wafer temperature maintained at 801° C., a multilayer body 120 was crystallographically grown. Specifically, four stacks were formed that were each composed of a 12-nm thick Si-doped InGaN (In composition, 0.04) layer and a 12-nm thick Si-doped GaN layer with the former on the side touching the first n-type buffer layer 10. The Si-doped GaN layer had an n-type impurity concentration of $7.4 \times 10^{18}$ cm$^{-3}$. The Si-doped InGaN layer had an n-type impurity concentration of $4 \times 10^{18}$ cm$^{-3}$.

A resulting nitride semiconductor light-emitting element (620×680 μm size) displayed blue light emission with a dominant wavelength of 450 nm when operated at room temperature with a current of 120 mA. The optical power was 171 mW, and the voltage applied was 3.06 V. The percentage of the optical power at 80° C. to that at room temperature was 98%. By adjusting an n-type impurity concentration in the multilayer body, the operation voltage was successfully fine-tuned without changing the optical power.

Example 9

In Example 9, the method described in Example 2 was followed to produce nitride semiconductor light-emitting elements except that the p-side intermediate layer 145 crystallographically grown on the top surface of the final well layer 14WF was an undoped GaN layer (4.0-nm thick). In this example, too, the p-type impurity diffused from the p-type nitride semiconductor layer 16 to the p-side intermediate layer but did not diffuse near the interface between the p-side intermediate layer 145 and the final well layer 14WF.

When a resulting nitride semiconductor light-emitting element was operated at room temperature with a current of 120 mA, its optical power and the voltage applied were similar to those in Example 2. The percentage of the optical power at 80° C. to that at room temperature was 98%.

Example 10

Figure 12:
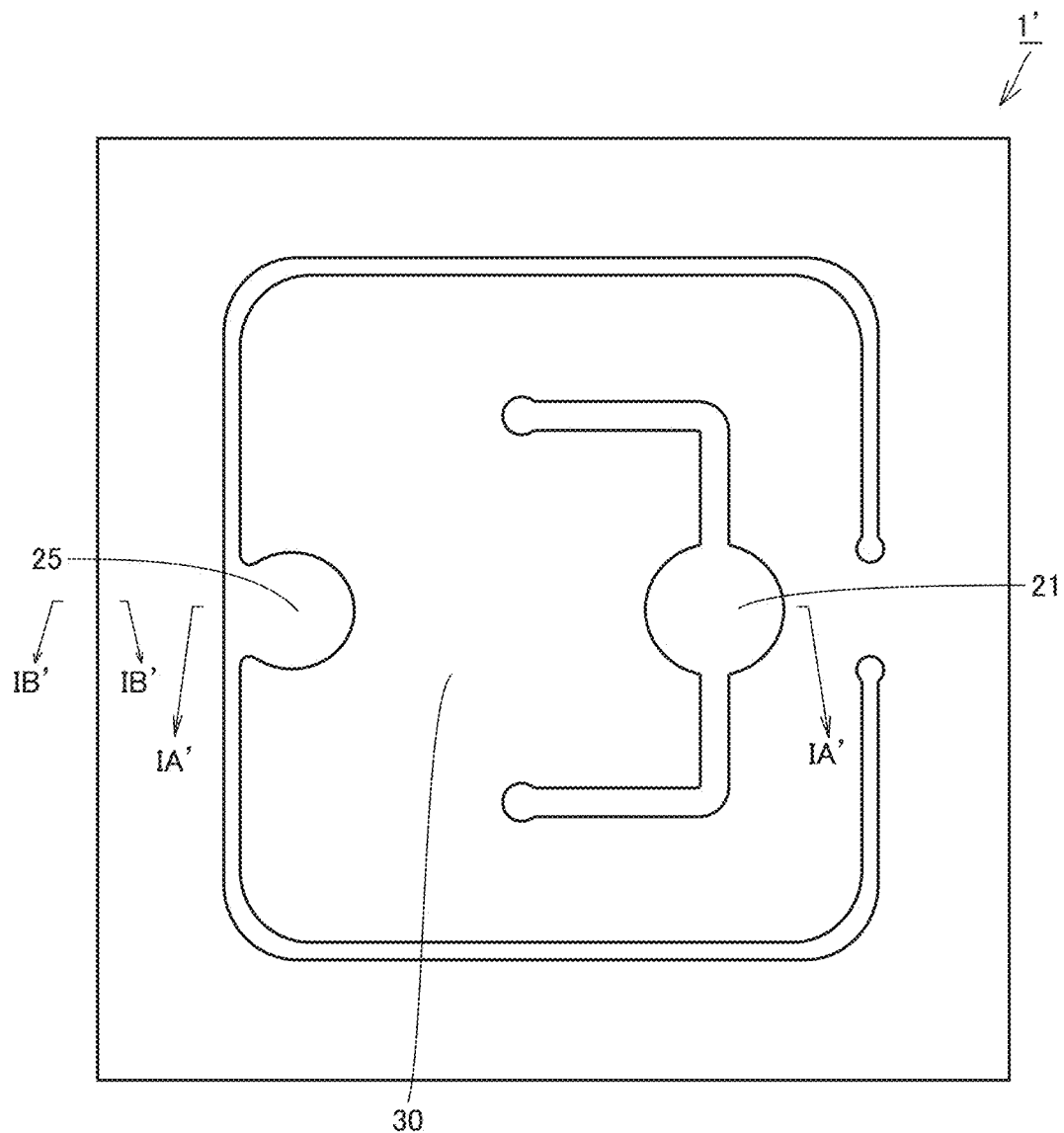
FIG. 12 is a plan view of a nitride semiconductor light-emitting element according to this embodiment of the present invention.

FIG. 11 is a cross-section of a room temperature characteristics-oriented nitride semiconductor light-emitting element according to another embodiment of the present invention. FIG. 12 is a plan view of the nitride semiconductor light-emitting element 1'. In FIG. 11, region IA' illustrates a cross-sectional structure viewed along line IA'-IA' in FIG. 12, and region IB' illustrates a cross-sectional structure viewed along line IB'-IB' in FIG. 12. This drawing differs from FIG. 1 in that there is a more dense population of large-sized V-pits 15.

Figure 13:
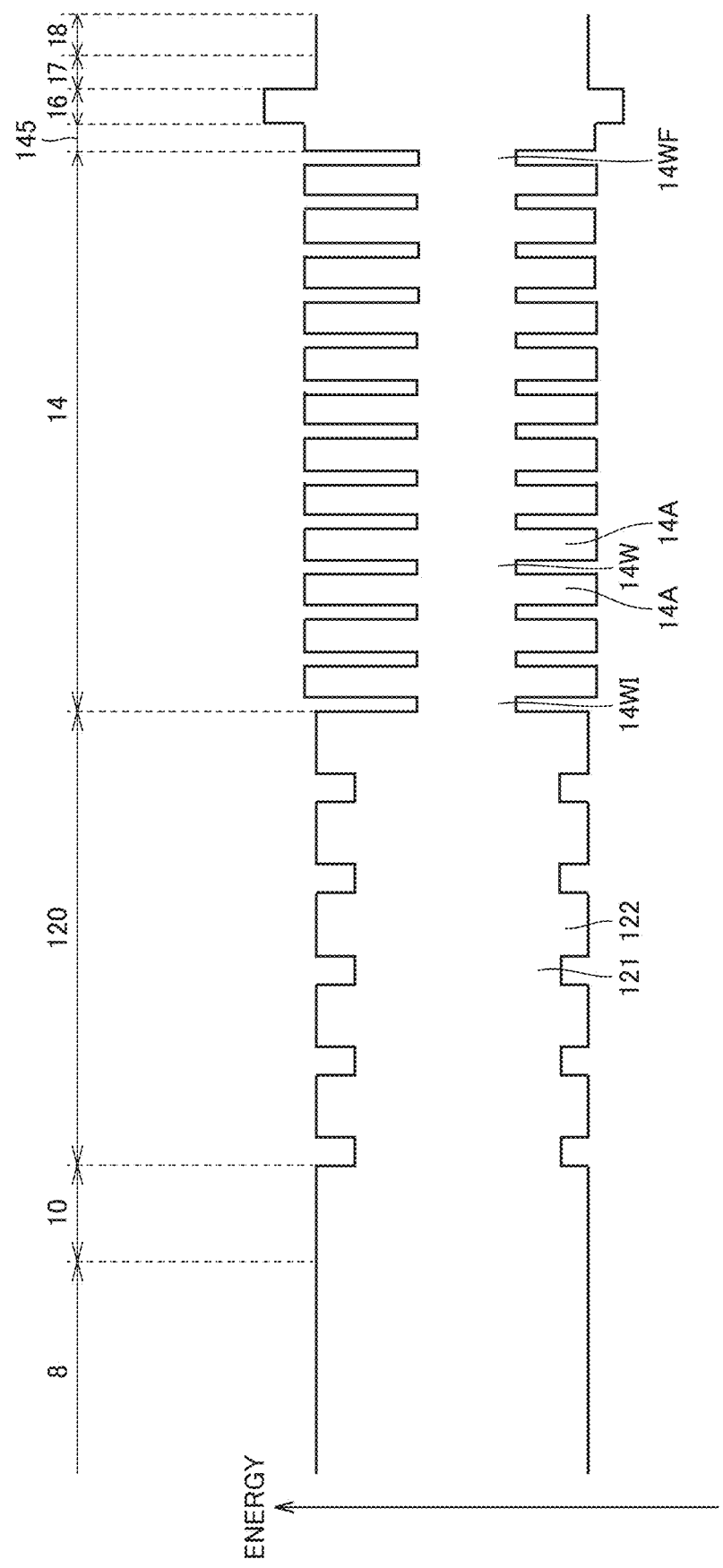
FIG. 13 is an energy band diagram that schematically illustrates the band structure of the nitride semiconductor light-emitting element according to Example 10.

In Example 10, nitride semiconductor light-emitting elements focused on characteristics at room temperature and having the energy band diagram illustrated in FIG. 13 were produced. The following describes differences from Example 1.
(Preparation of a Substrate (Wafer) to an N-Type Contact Layer)

The preparation of a substrate and the configuration of buffer to n-type contact layers are the same as in Example 1.
(Growth of a First N-Type Buffer Layer)

Same as in Example 1 except that the thickness was increased to 60 nm.
(Growth of a Multilayer Body to Growth of a Second N-Type Buffer Layer)

The multilayer body was formed as five stacks each composed of a 12-nm thick Si-doped InGaN (In composition, 0.04) layer and a 30-nm Si-doped GaN layer. The rest of the multilayer body is the same as in Example 1. This structure omits the second n-type buffer layer 13.
(Growth of a Light-Emitting Layer)

In forming a light-emitting layer 14 on the top surface of the multilayer body by crystallographically growing well layers 14W alternately with barrier layers 14A, the well layers 14W were a total of thirteen 3.0-nm thick undoped $In_xGa_{1-x}N$ (x=0.20) well layers. The barrier layers 14A, disposed alternately with the well layers, were a total of twelve undoped $Al_yGa_{1-y}N$ (y=0.001) layers as thick as 12 nm and were grown at a growth temperature higher than that for the well layers by 140° C. The wavelength of the photoluminescence from the light-emitting layer was 440 nm.

(Growth of a P-Side Intermediate Layer)

Same as in Example 1 except that the thickness of the p-side intermediate layer 145 was increased to 10.0 nm.

(Growth of P-Side Nitride Semiconductor Layers)

Same as in Example 1 except that the thickness of the p-type $Al_{0.18}Ga_{0.82}N$ layer (p-type nitride semiconductor layer 16; p-type impurity concentration, $2\times10^{19}$ cm$^{-3}$), deposited on the top surface of the p-side intermediate layer 145, was changed to 32 nm and that the thickness of the p-type GaN layer (p-type nitride semiconductor layer 17) was changed to 50 nm, p-type impurity concentration: $5\times10^{19}$ cm$^{-3}$.

(Etching and Formation of Electrodes)

No change from Example 1.

A resulting nitride semiconductor light-emitting element displayed blue light emission with a dominant wavelength of 450 nm under operating conditions of room temperature and 120 mA, with an optical power of 178 mW and a voltage applied of 3.09 V. Although the optical power percentage of 80° C. to room temperature, or the thermal characteristics, decreased to 94%, this example was superior to Example 4 in characteristics at room temperature. A comparative structure fabricated without the multilayer body had an optical power as low as 155 mW, clearly demonstrating the effect of the multilayer body 120.

In this structure, doping the lower six barrier layers in the light-emitting layer with silicon at $7\times10^{17}$/cm$^3$ reduced the voltage applied to 3.07 V. The optical power was 178.5 mV, with no meaningful difference.

Example 11

Figure 14:
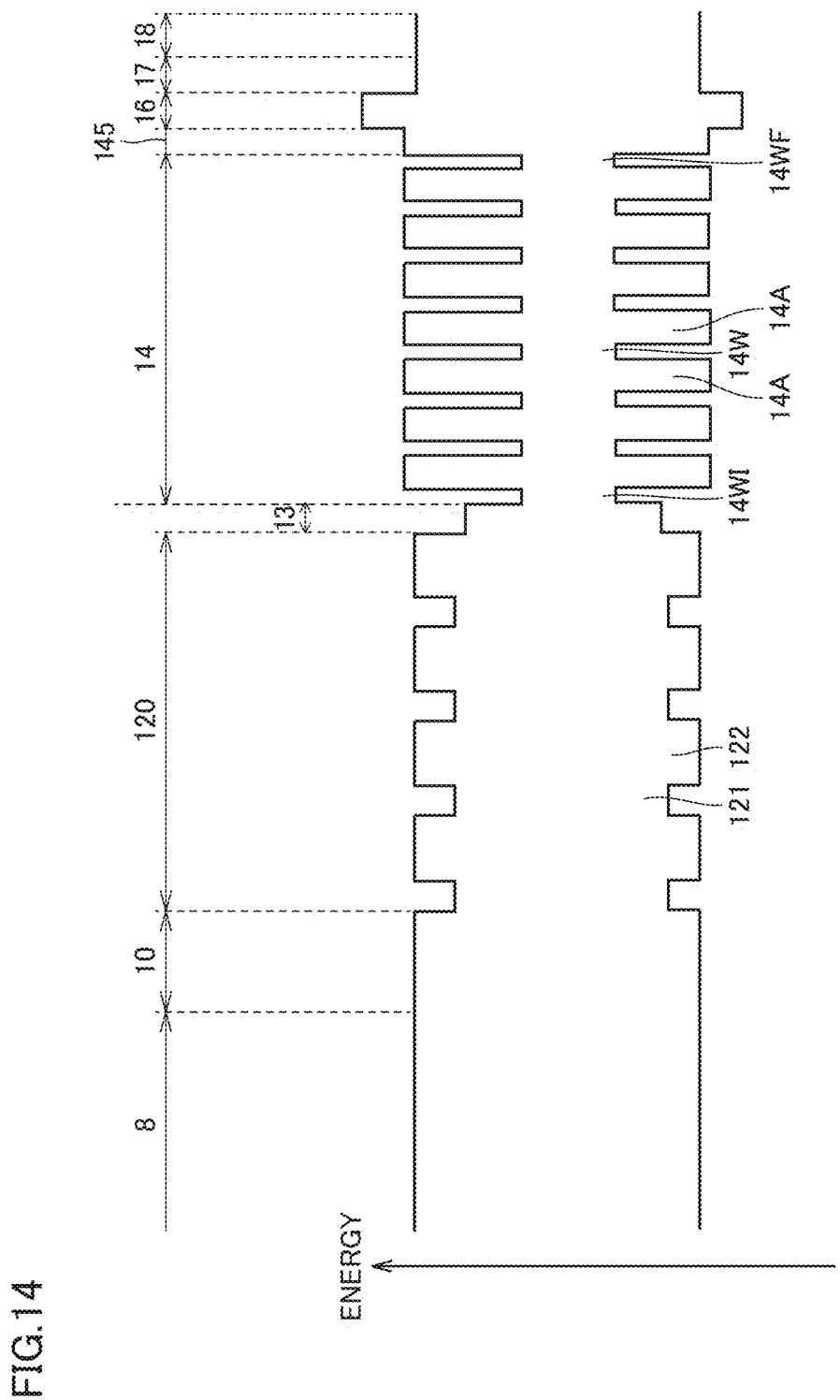
FIG. 14 is an energy band diagram that schematically illustrates the band structure of the nitride semiconductor light-emitting element according to Example 11.

In Example 11, nitride semiconductor light-emitting elements focused on characteristics at room temperature and having the energy band diagram illustrated in FIG. 14 were produced. The following describes differences from Example 4.

(Preparation of a Substrate (Wafer) to an N-Type Contact Layer)

The projections 3a on the wafer top surface had a diameter of approximately 1.6 μm. The interval between adjacent projections 3a (side length of the aforementioned triangles) based on apexes was 2.4 μm, and the height of the projections 3a was approximately 0.8 μm. The rest is the same as in Example 4. The configuration of buffer to n-type contact layers is also the same as in Example 4.

(Growth of a First N-Type Buffer Layer)

Same as in Example 4 except that the thickness was increased to 60 nm.

(Growth of a Multilayer Body to Growth of a Second N-Type Buffer Layer)

The multilayer body was formed as four stacks each composed of a 12-nm thick Si-doped InGaN (In composition, 0.04) layer and a 30-nm Si-doped GaN layer. The rest of the multilayer body and the second n-type buffer layer are the same as in Example 4.

(Growth of a Light-Emitting Layer)

In forming a light-emitting layer 14 on the top surface of the second n-type buffer layer by crystallographically growing well layers 14W alternately with barrier layers 14A, the well layers 14W were a total of eight 3.0-nm thick undoped $In_xGa_{1-x}N$ (x=0.20) well layers. The barrier layers 14A, disposed alternately with the well layers, were a total of seven undoped $Al_yGa_{1-y}N$ (y=0.001) layers as thick as 12 nm and were grown at a growth temperature higher than that for the well layers by 140° C. The wavelength of the photoluminescence from the light-emitting layer was 440 nm.

(Growth of a P-Side Intermediate Layer)

Same as in Example 4 except that the thickness of the p-side intermediate layer 145 was increased to 10.0 nm.

(Growth of P-Side Nitride Semiconductor Layers)

Same as in Example 4 except that the thickness of the p-type $Al_{0.18}Ga_{0.82}N$ layer (p-type nitride semiconductor layer 16; p-type impurity concentration, $2\times10^{19}$ cm$^{-3}$), deposited on the top surface of the p-side intermediate layer 145, was changed to 32 nm and that the thickness of the p-type GaN layer (p-type nitride semiconductor layer 17) was changed to 50 nm, p-type impurity concentration: $5\times10^{19}$ cm$^{-3}$.

(Etching and Formation of Electrodes)

No change from Example 4.

A resulting nitride semiconductor light-emitting element displayed blue light emission with a dominant wavelength of 450 nm under operating conditions of room temperature and 120 mA, with an optical power of 180 mW and a voltage applied of 3.07 V. Although the optical power percentage of 80° C. to room temperature, or the thermal characteristics, decreased to 94%, this example was superior to Example 4 in characteristics at room temperature. A comparative structure fabricated without the multilayer body had an optical power as low as 150 mW, clearly demonstrating the effect of the multilayer body 120.

Example 12

Figure 15:
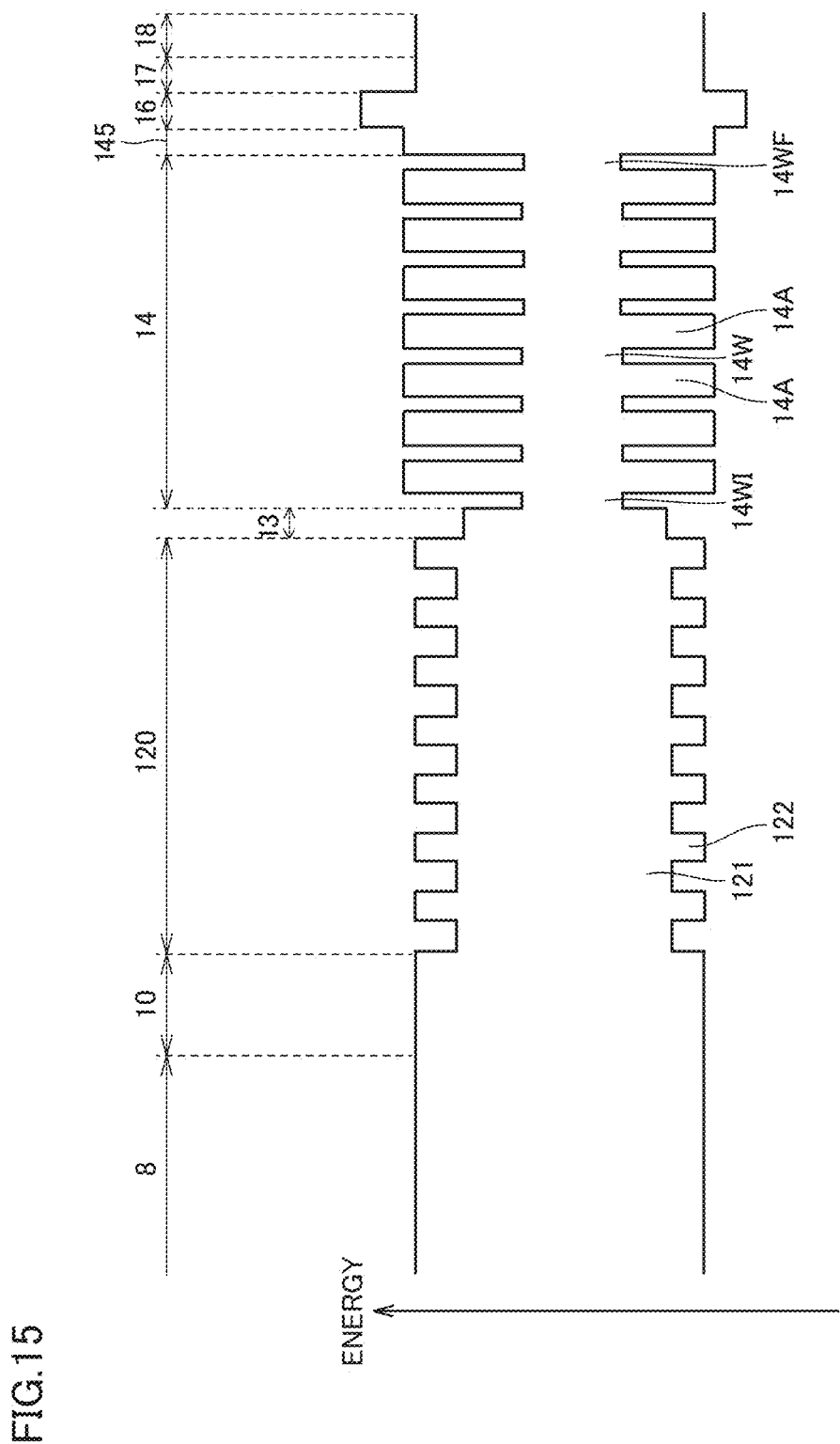
FIG. 15 is an energy band diagram that schematically illustrates the band structure of the nitride semiconductor light-emitting element according to Example 12.

In Example 12, nitride semiconductor light-emitting elements focused on characteristics at room temperature and having the energy band diagram illustrated in FIG. 15 were produced. The following describes differences from Example 11.

(Preparation of a Substrate (Wafer) to Growth of a First N-Type Buffer Layer)

Same as in Example 11.

(Growth of a Multilayer Body to Growth of a Second N-Type Buffer Layer)

The multilayer body was formed as seven stacks each composed of a 12-nm thick Si-doped InGaN (In composition, 0.04) layer and a 12-nm Si-doped GaN layer. The rest of the multilayer body and the second n-type buffer layer are the same as in Example 11. The number of times of stacking in this example, increased from that in Example 11, was intended to keep the same size of the V-pits as measured before the deposition of the light-emitting layer. When the number of times of stacking was four, the V-pits were as small as approximately 120 nm across, and the optical power was reduced.

(Growth of a Light-Emitting Layer to Growth of a P-Side Nitride Semiconductor Layers)

Same as in Example 11.

(Etching and Formation of Electrodes)

No change from Example 11.

A resulting nitride semiconductor light-emitting element displayed blue light emission with a dominant wavelength of 450 nm under operating conditions of room temperature and 120 mA, with an optical power of 180 mW and a voltage applied of 3.07 V. Although the optical power percentage of 80° C. to room temperature, or the thermal characteristics, decreased to 94%, this example was superior to Example 4 in characteristics at room temperature. A comparative structure fabricated without the multilayer body had an optical power as low as 150 mW, clearly demonstrating the effect of the multilayer body 120.

The embodiments and examples disclosed herein should be construed as being exemplary in all respects rather than being limiting. The scope of the present invention is defined not by the foregoing description but by the claims and is intended to include equivalents to the scope of the claims and all modifications that fall within the scope of the claims.

REFERENCE SIGNS LIST 1, 1' Nitride semiconductor light-emitting element; 3 Substrate; 3a Projection; 3b Recess; 5 Buffer layer; 7 Underlying layer; 8 N-type contact layer (n-type nitride semiconductor layer); 10 First n-type buffer layer; 13 Second n-type buffer layer; 14 Light-emitting layer; 14A Barrier layer; 14W Well layer; 14WF Final well layer; 14WI Initial well layer; 15 V-pit; 16, 17, 18 P-type nitride semiconductor layer; 21 N-side electrode; 23 Transparent electrode; 25 P-side electrode; 27 Transparent protection film; 30 Mesa portion; 120 Multilayer body; 121 First semiconductor layer; 122 Second semiconductor layer; 145 P-side intermediate layer.

The invention claimed is:

1. A nitride semiconductor light-emitting element comprising:
an n-type nitride semiconductor layer;
a light-emitting layer;
a p-type nitride semiconductor layer; and
a multilayer body between the n-type nitride semiconductor layer and the light-emitting layer, the multilayer body including at least one stack of a first semiconductor layer and a second semiconductor layer, wherein
both of the first semiconductor layer and the second semiconductor layer are doped with n-type impurity,
the second semiconductor layer has a greater band-gap energy than the first semiconductor layer,
the first semiconductor layer has a thickness of more than 10 nm and 30 nm or less, and the second semiconductor layer has a thickness of more than 10 nm and 40 nm or less, and
the light-emitting layer includes a plurality of V-shaped recesses (V-pits) with sizes of 150 nm or more in a cross-sectional view as seen in a direction perpendicular to a direction in which the first semiconductor layer and the second semiconductor are stacked.

2. The nitride semiconductor light-emitting element according to claim 1, wherein the V-shaped recesses (V-pits) reach the multilayer body at a bottom of a V-shape thereof.

3. The nitride semiconductor light-emitting element according to claim 1, wherein the V-shaped recesses (V-pits) are present as a large number of scattered cavities in a plan view of a top portion of the light-emitting layer with a plane surface density of the V-shaped recesses (V-pits) being $1 \times 10^8 / cm^2$ or more.

4. The nitride semiconductor light-emitting element according to claim 1, wherein the first semiconductor layer and the second semiconductor layer have equal n-type impurity concentrations.

5. The nitride semiconductor light-emitting element according to claim 1, wherein:
an n-type buffer layer is provided between the multilayer body and the light-emitting layer; and
the n-type buffer layer between the multilayer body and the light-emitting layer is an $Al_{x3}In_{y3}Ga_{1-x3-y3}N$ ($0 \leq x3 < 1$ and $0 \leq y3 < 1$) layer that contains an n-type impurity and is in contact with the light-emitting layer.

6. The nitride semiconductor light-emitting element according to claim 1, wherein:

an n-type buffer layer is provided between the n-type nitride semiconductor layer and the multilayer body; and
the n-type buffer layer between the n-type nitride semiconductor layer and the multilayer body is an $Al_{s4}In_{t4}Ga_{1-s4-t4}N$ ($0 \leq s4 < 1$ and $0 \leq t4 < 1$) layer that contains an n-type impurity and is in contact with the multilayer body.

7. The nitride semiconductor light-emitting element according to claim 6, wherein the n-type buffer layer between the n-type nitride semiconductor layer and the multilayer body has an n-type impurity concentration equal to at least one of an n-type impurity concentration of the first semiconductor layer and an n-type impurity concentration of the second semiconductor layer.

8. The nitride semiconductor light-emitting element according to claim 6, wherein the n-type buffer layer between the n-type nitride semiconductor layer and the multilayer body has an n-type impurity concentration less than an n-type impurity concentration of the n-type nitride semiconductor layer.

9. A nitride semiconductor light-emitting element comprising:
an n-type nitride semiconductor layer;
a light-emitting layer;
a p-type nitride semiconductor layer; and
a multilayer body between the n-type nitride semiconductor layer and the light-emitting layer, the multilayer body including at least one stack of a first semiconductor layer and a second semiconductor layer, wherein
an n-type impurity concentration of each of the first semiconductor layer and the second semiconductor layer in the multilayer body is $3 \times 10^{18}$ cm$^{-3}$ or more and less than $1.1 \times 10^{19}$ cm$^{-3}$,
the second semiconductor layer has a greater band-gap energy than the first semiconductor layer,
the first semiconductor layer has a thickness of more than 10 nm and 30 nm or less, and the second semiconductor layer has a thickness of more than 10 nm and 40 nm or less,
the thickness of the second semiconductor layer is not less than a thickness of any layer that constitutes the light-emitting layer, and
the light-emitting layer includes a plurality of V-shaped recesses (V-pits) in a cross-sectional view as seen in a direction perpendicular to a direction in which the first semiconductor layer and the second semiconductor are stacked.

10. The nitride semiconductor light-emitting element according to claim 9, wherein the V-shaped recesses (V-pits) reach the multilayer body at a bottom of a V-shape thereof.

11. The nitride semiconductor light-emitting element according to claim 9, wherein the V-shaped recesses (V-pits) are present as a large number of scattered cavities in a plan view of a top portion of the light-emitting layer with a plane surface density of the V-shaped recesses (V-pits) being $1 \times 10^8 / cm^2$ or more.

12. The nitride semiconductor light-emitting element according to claim 9, wherein the first semiconductor layer and the second semiconductor layer have equal n-type impurity concentrations.

13. The nitride semiconductor light-emitting element according to claim 9, wherein:
an n-type buffer layer is provided between the multilayer body and the light-emitting layer; and
the n-type buffer layer between the multilayer body and the light-emitting layer is an $Al_{x3}In_{y3}Ga_{1-x3-y3}N$ ($0 \leq x3 < 1$ and $0 \leq y3 < 1$) layer that contains an n-type impurity and is in contact with the light-emitting layer.

14. The nitride semiconductor light-emitting element according to claim 9, wherein:
an n-type buffer layer is provided between the n-type nitride semiconductor layer and the multilayer body; and
the n-type buffer layer between the n-type nitride semiconductor layer and the multilayer body is an $Al_{s4}In_{t4}Ga_{1-s4-t4}N$ ($0 \leq s4 < 1$ and $0 \leq t4 < 1$) layer that contains an n-type impurity and is in contact with the multilayer body.

15. The nitride semiconductor light-emitting element according to claim 14, wherein the n-type buffer layer between the n-type nitride semiconductor layer and the multilayer body has an n-type impurity concentration equal to at least one of an n-type impurity concentration of the first semiconductor layer and an n-type impurity concentration of the second semiconductor layer.

16. A nitride semiconductor light-emitting element comprising:
an n-type nitride semiconductor layer;
a light-emitting layer;
a p-type nitride semiconductor layer; and
a multilayer body between the n-type nitride semiconductor layer and the light-emitting layer, the multilayer body including three or more and seven or less of stacks of a first semiconductor layer and a second semiconductor layer,
an n-type impurity concentration of each of the first semiconductor layer and the second semiconductor layer in the multilayer body is $3 \times 10^{18}$ cm$^{-3}$ or more and less than $1.1 \times 10^{19}$ cm$^{-3}$,
the second semiconductor layer has a greater band-gap energy than the first semiconductor layer,
the first semiconductor layer has a thickness of more than 10 nm and 30 nm or less, and the second semiconductor layer has a thickness of more than 10 nm and 40 nm or less, and
the light-emitting layer includes a plurality of V-shaped recesses (V-pits) with sizes of 150 nm or more in a cross-sectional view as seen in a direction perpendicular to a direction in which the first semiconductor layer and the second semiconductor are stacked.

17. The nitride semiconductor light-emitting element according to claim 16, wherein the V-shaped recesses (V-pits) reach the multilayer body at a bottom of a V-shape thereof.

18. The nitride semiconductor light-emitting element according to claim 16, wherein the V-shaped recesses (V-pits) are present as a large number of scattered cavities in a plan view of a top portion of the light-emitting layer with a plane surface density of the V-shaped recesses (V-pits) being $1 \times 10^8$/cm$^2$ or more.

19. The nitride semiconductor light-emitting element according to claim 16, wherein the first semiconductor layer and the second semiconductor layer have equal n-type impurity concentrations.

20. The nitride semiconductor light-emitting element according to claim 16, wherein:
an n-type buffer layer is provided between the multilayer body and the light-emitting layer; and
the n-type buffer layer between the multilayer body and the light-emitting layer is an $Al_{x3}In_{y3}Ga_{1-x3-y3}N$ ($0 \leq x3 < 1$ and $0 \leq y3 < 1$) layer that contains an n-type impurity and is in contact with the light-emitting layer.

21. The nitride semiconductor light-emitting element according to claim 16, wherein:
an n-type buffer layer is provided between the n-type nitride semiconductor layer and the multilayer body; and
the n-type buffer layer between the n-type nitride semiconductor layer and the multilayer body is an $Al_{s4}In_{t4}Ga_{1-s4-t4}N$ ($0 \leq s4 < 1$ and $0 \leq t4 < 1$) layer that contains an n-type impurity and is in contact with the multilayer body.

22. The nitride semiconductor light-emitting element according to claim 21, wherein the n-type buffer layer between the n-type nitride semiconductor layer and the multilayer body has an n-type impurity concentration equal to at least one of an n-type impurity concentration of the first semiconductor layer and an n-type impurity concentration of the second semiconductor layer.

23. A nitride semiconductor light-emitting element comprising:
an n-type nitride semiconductor layer;
a light-emitting layer;
a p-type nitride semiconductor layer; and
a multilayer body between the n-type nitride semiconductor layer and the light-emitting layer, the multilayer body including at least one stack of a first semiconductor layer and a second semiconductor layer, wherein
an n-type impurity concentration of each of the first semiconductor layer and the second semiconductor layer in the multilayer body is $3 \times 10^{18}$ cm$^{-3}$ or more and less than $1.1 \times 10^{19}$ cm$^{-3}$,
the first semiconductor layer contains Indium and the second semiconductor layer contains less Indium than the first semiconductor layer,
the first semiconductor layer has a thickness of more than 10 nm and 30 nm or less, and the second semiconductor layer has a thickness of more than 10 nm and 40 nm or less, and
the light-emitting layer includes a plurality of V-shaped recesses (V-pits) with sizes of 150 nm or more in a cross-sectional view as seen in a direction perpendicular to a direction in which the first semiconductor layer and the second semiconductor layer are stacked.

24. The nitride semiconductor light-emitting element according to claim 23, wherein the V-shaped recesses (V-pits) reach the multilayer body at a bottom of a V-shape thereof.

25. The nitride semiconductor light-emitting element according to claim 23, wherein the V-shaped recesses (V-pits) are present as a large number of scattered cavities in a plan view of a top portion of the light-emitting layer with a plane surface density of the V-shaped recesses (V-pits) being $1 \times 10^8$/cm$^2$ or more.

26. The nitride semiconductor light-emitting element according to claim 23, wherein the first semiconductor layer and the second semiconductor layer have equal n-type impurity concentrations.

27. The nitride semiconductor light-emitting element according to claim 23, wherein:
an n-type buffer layer is provided between the multilayer body and the light-emitting layer; and
the n-type buffer layer between the multilayer body and the light-emitting layer is an $Al_{x3}In_{y3}Ga_{1-x3-y3}N$ ($0 \leq x3 < 1$ and $0 \leq y3 < 1$) layer that contains an n-type impurity and is in contact with the light-emitting layer.

28. The nitride semiconductor light-emitting element according to claim 23, wherein:

an n-type buffer layer is provided between the n-type nitride semiconductor layer and the multilayer body; and the n-type buffer layer between the n-type nitride semiconductor layer and the multilayer body is an $Al_{s4}In_{t4}Ga_{1-s4-t4}N$ ($0 \leq s4 < 1$ and $0 \leq t4 < 1$) layer that contains an n-type impurity and is in contact with the multilayer body.

29. The nitride semiconductor light-emitting element according to claim 28, wherein the n-type buffer layer between the n-type nitride semiconductor layer and the multilayer body has an n-type impurity concentration equal to at least one of an n-type impurity concentration of the first semiconductor layer and an n-type impurity concentration of the second semiconductor layer.

* * * * *